US008622780B2

(12) United States Patent
Ikeda et al.

(10) Patent No.: US 8,622,780 B2
(45) Date of Patent: Jan. 7, 2014

(54) LIGHT-EMITTING ELEMENT, LIGHT-EMITTING DEVICE, AND VAPOR DEPOSITION APPARATUS

(75) Inventors: Hisao Ikeda, Kanagawa (JP); Junichiro Sakata, Kanagawa (JP); Satoshi Seo, Kanagawa (JP); Yuji Iwaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/402,974

(22) Filed: Feb. 23, 2012

(65) Prior Publication Data

US 2012/0149140 A1 Jun. 14, 2012

Related U.S. Application Data

(63) Continuation of application No. 11/909,051, filed as application No. PCT/JP2006/307993 on Apr. 10, 2006, now Pat. No. 8,125,144.

(30) Foreign Application Priority Data

Apr. 11, 2005 (JP) .................................. 2005-113053

(51) Int. Cl.
  *H01J 9/24* (2006.01)
(52) U.S. Cl.
  USPC ................ 445/23; 445/24; 445/25; 313/504; 313/506
(58) Field of Classification Search
  USPC ............... 445/23–25; 313/504, 506
  See application file for complete search history.

(56) References Cited

U.S. PATENT DOCUMENTS

| | | | | |
|---|---|---|---|---|
| 4,810,605 A | * | 3/1989 | Yoshizawa et al. | 430/57.7 |
| 4,851,312 A | * | 7/1989 | Yoshizawa et al. | 430/57.7 |
| 4,954,389 A | * | 9/1990 | Acharya et al. | 428/212 |
| 5,783,292 A | | 7/1998 | Tokito et al. | |

(Continued)

FOREIGN PATENT DOCUMENTS

| | | |
|---|---|---|
| EP | 1 255 281 A2 | 11/2002 |
| EP | 1603174 A2 | 12/2005 |

(Continued)

OTHER PUBLICATIONS

PCT Written Opinion (Application No. PCT/JP2006/307993) mailed Aug. 8, 2006—5 pages.

(Continued)

*Primary Examiner* — Nimeshkumar Patel
*Assistant Examiner* — Thomas A Hollweg
(74) *Attorney, Agent, or Firm* — Fish & Richardson P.C.

(57) ABSTRACT

To provide a light-emitting element and a light-emitting device which can be designed and manufactured with redundancy. A light-emitting element of the invention includes a pair of electrode, and a layer containing a light-emissive substance between the pair of electrodes. The layer containing a light-emissive substance includes a layer containing a composite material, and the layer containing a composite material includes an organic compound and an inorganic compound. The concentration ratio of the organic compound to the inorganic compound changes periodically. The layer containing a composite maternal can be changed in electrical characteristics without changing the composition ratio of the organic compound to the inorganic compound in the layer or changing the kind of compounds used for the layer.

30 Claims, 22 Drawing Sheets

(56) References Cited

U.S. PATENT DOCUMENTS

| | | | |
|---|---|---|---|
| 6,423,429 | B2 | 7/2002 | Kido et al. |
| 6,566,807 | B1 | 5/2003 | Fujita et al. |
| 6,580,213 | B2 | 6/2003 | Yamazaki |
| 6,589,673 | B1 | 7/2003 | Kido et al. |
| 6,600,203 | B2 * | 7/2003 | Takahashi et al. ............ 257/442 |
| 6,728,278 | B2 * | 4/2004 | Kahen et al. .................... 372/39 |
| 6,806,491 | B2 * | 10/2004 | Qiu et al. ......................... 257/40 |
| 6,818,329 | B1 | 11/2004 | Liao et al. |
| 7,041,390 | B2 | 5/2006 | Seo et al. |
| 7,242,703 | B2 * | 7/2007 | Forrest et al. ................... 372/39 |
| 7,511,418 | B2 | 3/2009 | Yamazaki et al. |
| 7,795,806 | B2 | 9/2010 | Aziz et al. |
| 2002/0028329 | A1 | 3/2002 | Ise et al. |
| 2002/0086180 | A1 | 7/2002 | Seo et al. |
| 2002/0096995 | A1 | 7/2002 | Mishima et al. |
| 2002/0158251 | A1 * | 10/2002 | Takahashi et al. .............. 257/70 |
| 2002/0180349 | A1 | 12/2002 | Aziz et al. |
| 2003/0127967 | A1 | 7/2003 | Tsutsui et al. |
| 2003/0162314 | A1 | 8/2003 | Yamazaki et al. |
| 2003/0197465 | A1 | 10/2003 | Qiu et al. |
| 2003/0209974 | A1 | 11/2003 | Yamazaki |
| 2003/0218418 | A9 | 11/2003 | Sato et al. |
| 2003/0234609 | A1 | 12/2003 | Aziz et al. |
| 2004/0012331 | A1 | 1/2004 | Yamazaki et al. |
| 2005/0048311 | A1 | 3/2005 | Hatwar et al. |
| 2005/0084712 | A1 | 4/2005 | Kido et al. |
| 2005/0088083 | A1 | 4/2005 | Seo et al. |
| 2005/0110007 | A1 * | 5/2005 | Forrest et al. ................... 257/40 |
| 2005/0162074 | A1 | 7/2005 | Madathil et al. |
| 2005/0260442 | A1 | 11/2005 | Yu et al. |
| 2005/0271898 | A1 | 12/2005 | Kim et al. |
| 2006/0119262 | A1 | 6/2006 | Ikeda et al. |
| 2006/0133437 | A1 * | 6/2006 | Forrest et al. ................... 372/39 |
| 2006/0144335 | A1 * | 7/2006 | Lee et al. ....................... 118/719 |
| 2006/0243967 | A1 | 11/2006 | Nomura et al. |
| 2006/0244373 | A1 | 11/2006 | Nomura et al. |
| 2006/0257684 | A1 | 11/2006 | Arakane et al. |
| 2006/0261727 | A1 | 11/2006 | Aziz et al. |
| 2006/0263628 | A1 | 11/2006 | Aziz et al. |
| 2007/0042221 | A1 | 2/2007 | Kawamura |
| 2007/0200125 | A1 | 8/2007 | Ikeda et al. |
| 2008/0038583 | A1 | 2/2008 | Itai et al. |

FOREIGN PATENT DOCUMENTS

| | | |
|---|---|---|
| EP | 1631125 A1 | 3/2006 |
| JP | 11-251067 A | 9/1999 |
| JP | 2001-244079 A | 9/2001 |
| JP | 2002-237388 A | 8/2002 |
| JP | 2002-329670 A | 11/2002 |
| JP | 2003-229269 A | 8/2003 |
| JP | 2004-031323 A | 1/2004 |
| JP | 2004253373 | 9/2004 |
| JP | 2004-349007 A | 12/2004 |
| JP | 2005-347271 A | 12/2005 |
| WO | WO 2005/064994 A1 | 7/2005 |

OTHER PUBLICATIONS

PCT International Search Report (Application No. PCT/JP2006/307993) mailed Aug. 8, 2006—3 pages.

Tokito et al., "Metal Oxides as a Hole-injecting Layer for an Organic Electroluminescent Device", J. Phys. D: Appl. Phys. 29, pp. 2750-2753 (Jul. 1996).

Jingsong Huang et al.; "High-brightness organic double-quantum-well electroluminescent devices"; Applied Physics Letters, vol. 77, No. 12; pp. 1750-1752; Sep. 18, 2000.

Ren Xiaofan et al.; "Ultrahigh Energy Gap Hosts in Deep Blue Organic Electrophosphorescent Devices," Chem. Mater. (vol. 16, No. 23, pp. 4743-4747) 2004.

Korean Office Action (KR Patent Application No. 2012-7025470) dated Jan. 14, 2013, 7 pages, with English translation.

* cited by examiner

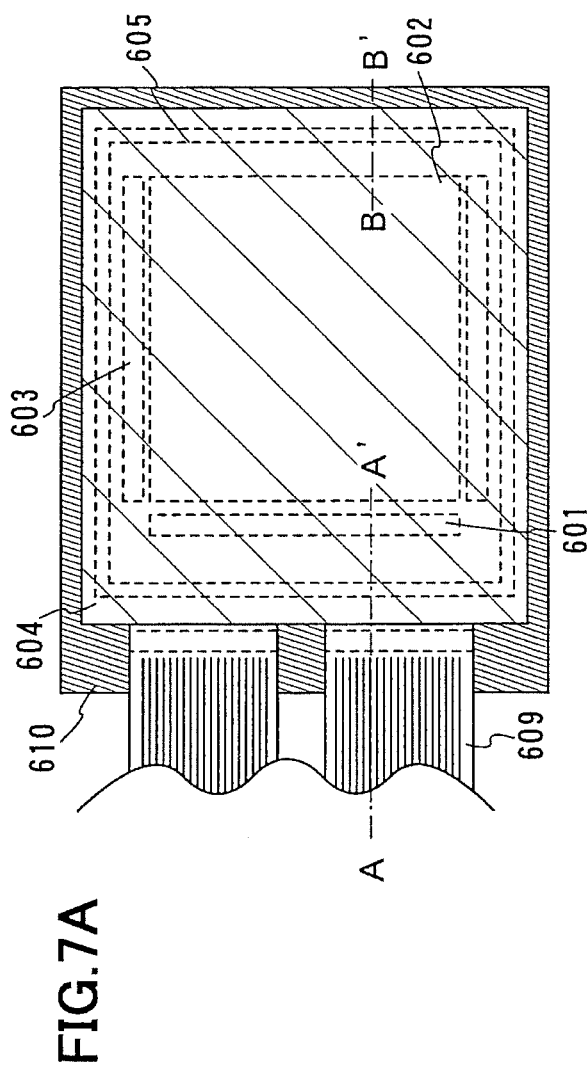
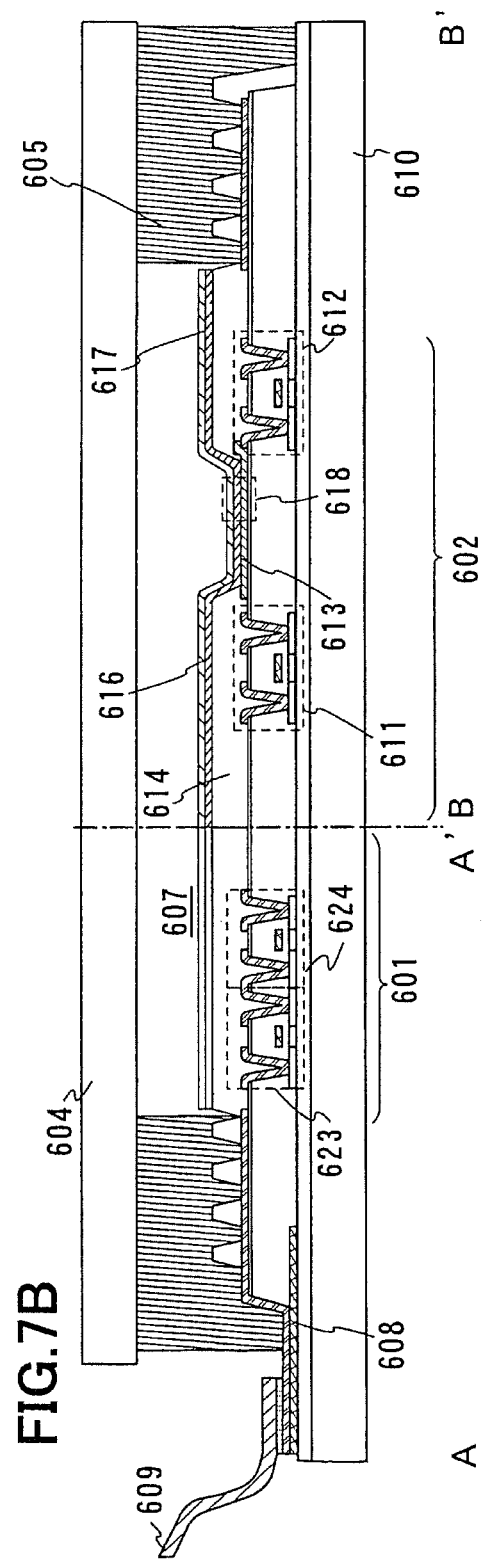
FIG.7A
FIG.7B

LIGHT-EMITTING ELEMENT, LIGHT-EMITTING DEVICE, AND VAPOR DEPOSITION APPARATUS

CROSS-REFERENCE TO RELATED APPLICATIONS

This application is a continuation of U.S. application Ser. No. 11/909,051, filed Sep. 18, 2007, now allowed, which is a U.S. National Phase of International Patent Application No. PCT/JP2006/307993, filed Apr. 10, 2006, which claims the benefit of foreign priority application filed in Japan as Serial No. 2005-113053 on Apr. 11, 2005, all of which are incorporated by reference.

TECHNICAL FIELD

The present invention relates to a light-emitting element utilizing electroluminescence and a light-emitting device having the light-emitting element, and an apparatus for manufacturing the light-emitting device.

BACKGROUND ART

In recent years, light-emitting elements using light-emissive organic compounds have actively been researched and developed. Such light-emitting elements basically have a structure where a layer containing a light-emissive organic compound is sandwiched between a pair of electrodes. By applying a voltage to such elements, electrons and holes are respectively injected into the layer containing a light-emissive organic compound from the pair of electrodes, and thus current flows therein. Then, these carriers (electrons and holes) are recombined with each other to bring the light-emissive organic compound into an excited state. The light-emissive organic compound emits light upon returning from the excited state to the ground state. Because of such a mechanism, the light-emitting element is called a light-emitting element of a current excitation type.

Note that as the kind of excited states formed by an organic compound, there are a singlet excited state and a triplet excited state. Light emission obtained from the singlet excited state is called fluorescence, while light emission obtained from the triplet excited state is called phosphorescence.

Since such a light-emitting element is formed of an organic thin film with a thickness of about, for example, 0.1 µm, it has a big advantage in that manufacture with thin shape and light weight is enabled. In addition, there is another advantage in that quite a high response speed is achieved since it takes only about 1µ second or less from the time when carriers are injected until the light emission is obtained. Such characteristics are considered as advantageous for a flat panel display element.

Further, since such a light-emitting element is formed in a film form, light emission with a plane surface can be easily obtained by forming a light-emitting element with a large area. Such an advantage cannot be obtained easily with either a point light source typified by an incandescent lamp or an LED or a linear light source typified by a fluorescent lamp; therefore, the light-emitting element has a high potential to be used as a surface light source which can be applied to illumination or the like.

As described above, a light-emitting element of a current excitation type which uses a light-emissive organic compound is expected to be applied to various fields such as a light-emitting device and illumination; however, there remain a number of essential tasks to be completed. As one of the tasks, there is a reduction in power consumption. In order to reduce power consumption, it is required to reduce the driving voltage of the light-emitting element. Since the emission intensity of a light-emitting element of a current excitation type is determined by the amount of current flowing therein, it is required to flow large current with low voltage in order to reduce the driving voltage of the light-emitting element.

According to Patent Document 1, it is reported that a driving voltage of a light-emitting element can be decreased by doping an organic layer which is in contact with an anode with an electron-accepting compound having a property capable of oxidizing an organic compound contained in the organic layer. The organic layer doped with an electron-accepting dopant does not cause a voltage rise in the element even when it is formed thick; therefore, a distance between the electrodes can be set longer than usual, which is advantageous in that a possibility of causing a short circuit can be significantly reduced.

Meanwhile, various attempts have been made to increase the extraction efficiency of light emitted from a light-emitting element to the outside by adjusting the optical distance. According to Patent Document 2, it is reported that the emission spectrum can be controlled by changing the thickness of an organic compound layer doped with an electron-accepting compound which is provided in the interface between an anode and a light-emitting layer.

The organic compound layer doped with an electron-accepting compound disclosed in Patent Document 1 and Patent Document 2 is formed by adding an electron-accepting compound by co-deposition or by applying a liquid solution which is adjusted by reacting an electron-accepting compound with an organic compound. Therefore, the organic compound and the electron-accepting compound are uniformly mixed, and thus the organic compound layer doped with the electron-accepting compound has isotropic conductivity.

Accordingly, in order to control the electrical characteristics such as conductivity, it has been required to change the composition ratio of the organic compound to the electron-accepting compound included in the layer, or to change the kind of compounds included in the layer.

However, when the composition ratio of the layer is changed or the kind of compounds included in the layer is changed, characteristics other than the electrical characteristics, for example, optical characteristics (e.g., refractive index) change. If the optical characteristics change, the emission spectrum changes, which in turn changes the emission color and the extraction efficiency of light to the outside. Thus, it has been difficult to change the electrical characteristics without changing the optical characteristics.

That is, light-emitting elements are required to be designed exactly in consideration of various characteristics such as the electrical characteristics and optical characteristics. In addition, light-emitting elements have been required to be manufactured very exactly in accordance with its original design.

[Patent Document 1]
Japanese Patent Laid-Open No. H11-251067
[Patent Document 2]
Japanese Patent Laid-Open No. 2001-244079

DISCLOSURE OF INVENTION

In view of the foregoing, it is an object of the invention to provide a light-emitting element and a light-emitting device which can be designed and manufactured with redundancy.

The inventors discovered that the aforementioned problems can be solved by manufacturing a light-emitting element which includes a layer containing a composite material, as a result of keen examination.

One feature of the invention of this specification is to provide a light-emitting element including a pair of electrodes and a layer containing a light-emissive substance sandwiched therebetween, where the layer containing a light-emissive substance includes a layer containing a composite material, the layer containing a composite material includes an organic compound and an inorganic compound, and the concentration ratio of the organic compound to the inorganic compound changes periodically.

One feature of the invention of this specification is to provide a light-emitting element including a pair of electrodes and a layer containing a light-emissive substance sandwiched therebetween, where the layer containing a light-emissive substance includes a layer containing a composite material, the layer containing a composite material includes an organic compound and an inorganic compound, and the concentration of the inorganic compound changes periodically.

In the aforementioned structure, the concentration of the inorganic compound is preferably not less than 5 wt % and not more than 90 wt %. More preferably, the concentration of the inorganic compound is not less than 10 wt % and not more than 80 wt %.

One feature of the invention is to provide a light-emitting element including a pair of electrodes and a layer containing a light-emissive substance sandwiched therebetween, where the layer containing a light-emissive substance includes a layer containing a composite material, the layer containing a composite material includes an organic compound and an inorganic compound, and the concentration of the organic compound changes periodically.

In the aforementioned structure, the concentration of the organic compound is preferably not less than 10 wt % and not more than 95 wt %. More preferably, the concentration of the organic compound is not less than 20 wt % and not more than 90 wt %.

In the aforementioned structure, one cycle of the periodic change is preferably not less than 0.5 nm and not more than 30 nm. In particular, one cycle of the periodic change is preferably not less than 1 nm and not more than 10 nm.

In the aforementioned structure, the layer containing a composite material is preferably provided in contact with one of the pair of electrodes. Alternatively, two layers each containing a composite material may be provided so as to be in contact with the pair of electrodes respectively.

In the aforementioned structure, the inorganic compound is transition metal oxide. Specifically, the transition metal oxide is one or more of titanium oxide, zirconium oxide, hafnium oxide, vanadium oxide, niobium oxide, tantalum oxide, chromium oxide, molybdenum oxide, tungsten oxide, manganese oxide, and rhenium oxide.

In the aforementioned structure, the organic compound has a hole transporting property. In particular, the organic compound is preferably an organic compound having an arylamine skeleton or a carbazole skeleton.

One feature of the invention is to provide a light-emitting element including a pair of electrodes, and a layer containing a light-emissive substance sandwiched therebetween. Based on an image observed with a transmission electron microscope, the layer containing a light-emissive substance has a stack where a region having a high average atomic weight and a region having a low average atomic weight are alternately stacked, and the thickness of the stack is not less than 0.5 nm and not more than 30 nm. Note that a region having a high average atomic weight and a region having a low average atomic weight are called a region having a concentration an inorganic compound higher than a concentration of an organic compound and a region having a concentration an inorganic compound lower than a concentration of an organic compound in this specification.

One feature of the invention of this specification is to provide a light-emitting element including a pair of electrodes, and a layer containing a light-emissive substance sandwiched therebetween. Based on an image observed with a transmission electron microscope, the layer containing a light-emissive substance has a stack where a region having a high average atomic weight and a region having a low average atomic weight are alternately stacked, and the thickness of the stack is not less than 1 nm and not more than 10 nm.

One feature of the invention of this specification is to provide a light-emitting element including a pair of electrodes and a layer containing a light-emissive substance sandwiched therebetween. Based on an image observed with a transmission electron microscope, the layer containing a light-emissive substance has a stack where a region with a dark color and a region with a light color are alternately stacked, and the thickness of the stack is not less than 0.5 nm and not more than 30 nm.

One feature of the invention of this specification is to provide a light-emitting element including a pair of electrodes and a layer containing a light-emissive substance sandwiched therebetween. Based on an image observed with a transmission electron microscope, the layer containing a light-emissive substance has a stack where a region with a dark color and a region with a light color are alternately stacked, and the thickness of the stack is not less than 1 nm and not more than 10 nm.

In the aforementioned structure, the layer containing a light-emissive substance includes an organic compound and an inorganic compound.

In addition, the invention provides a light-emitting device having the aforementioned light-emitting element. The light-emitting device in this specification includes a light-emitting element and a means for controlling light emission of the light-emitting element. Specifically, the light-emitting device includes an image display device and a light source (including a lighting system). In addition, the light-emitting device includes all of a module where a light-emitting device is provided with a connector such as an FPC (Flexible Printed Circuit), a TAB (Tape Automated Bonding) tape, or a TCP (Tape Carrier Package); a module where an end of the TAB tape or TCP is provided with a printed wiring board; and a module where an IC (Integrated Circuit) is directly mounted on a light-emitting element by COG (Chip On Glass) bonding.

In the light-emitting element of the invention, a layer containing a composite material can be changed in electrical characteristics such as conductivity in particular, without changing the composition ratio or changing the kind of compounds. Therefore, other characteristics such as the optical characteristics are not changed much. Accordingly, a light-emitting element and a light-emitting device can be manufactured with redundancy.

BRIEF DESCRIPTION OF DRAWINGS

In the accompanying drawings:

FIGS. 7A and 7B each illustrate a light-emitting device of the invention;

BEST MODE FOR CARRYING OUT THE INVENTION

Figure 1A:
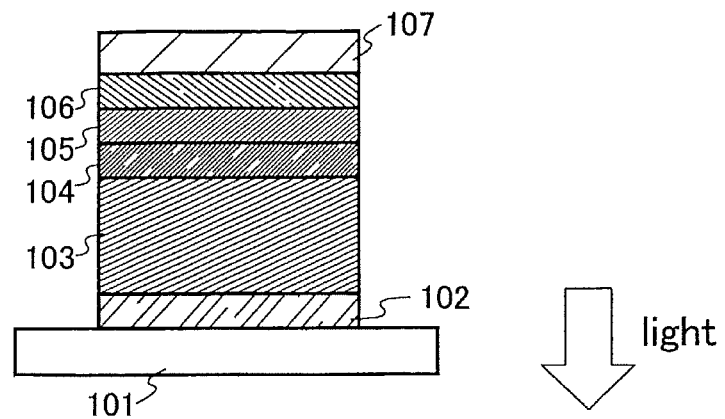
FIGS. 1A to 1C illustrate light-emitting elements of the invention.

Although the invention will be fully described by way of embodiment modes and embodiment with reference to the accompanying drawings, it is to be understood that various changes and modifications will be apparent to those skilled in the art. Therefore, unless otherwise such changes and modifications depart from the scope of the invention, they should be construed as being included therein.

(Embodiment Mode 1)

In this embodiment mode, description is made on a layer containing a composite material which is included in the light-emitting element of the invention.

The layer containing a composite material includes an organic compound and an inorganic compound, and the concentration ratio of the organic compound to the inorganic compound changes periodically. Since the concentration ratio of the organic compound to the inorganic compound changes periodically, conductivity in a stacked direction (also called a thickness direction) can be controlled. The "stacked direction" in this specification means a direction in one electrode of electrodes at the both side of the layer containing the composite material from the other electrode of the electrodes.

By changing the length of a cycle in which the concentration ratio of the organic compound to the inorganic compound changes periodically, a layer having desired conductivity can be obtained. For example, conductivity in the stacked direction (thickness direction) can be increased by shortening one cycle of the periodic change in the concentration ratio, whereas the conductivity in the stacked direction can be decreased by lengthening the one cycle. "A concentration ratio or a concentration changes periodically" in this specification means that the concentration ratio or the concentration changes in the stacked direction so that a maximum value and a minimum value of the concentration ratio or the concentration are alternately repeated. The periodical change includes both a monotonous increase and a monotonous decrease. Note that, it is not necessary that repeated periods of the periodical change are the same completely and it is not necessary that repeated amplitudes of the periodical change are the same completely.

The organic compound and the inorganic compound included in the layer containing a composite material are insulators; therefore, conductivity as roughly an insulator can be obtained in the surface direction of the layer containing a composite material. Accordingly, desired conductivity can be obtained in the direction in which the concentration ratio changes periodically (e.g., stacked direction or thickness direction), while the conductivity in the direction in which the concentration ratio does not change periodically (e.g., surface direction) has a constant value, and therefore, there is an anisotropy in conductivity.

As an organic compound included in the layer containing a composite material, a material with an excellent hole transporting property is preferably used. In particular, an organic material having an arylamine skeleton is preferably used, and for example, a layer formed of the following aromatic amine compound (i.e., having benzene ring-nitrogen bonds) can be used: 4,4'-bis(N-(4-(N,N-di-m-tolylamino)phenyl)-N-phenylamino)biphenyl (abbreviation: DNTPD); 4,4'-bis[N-(4-diphenylaminophenyl)-N-phenylamino]biphenyl (abbreviation: DPAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: a-NPD); 4,4'-bis[N-(9,9-dimethylfluorene-2-yl)-N-phenylamino]biphenyl (abbreviation: DFLDPBi); 4,4'-bis[N-(4-biphenylyl)-N-phenylamino]biphenyl (abbreviation: BBPB); 1,5-bis(diphenylamino)naphthalene (abbreviation: DPAN); 4,4',4''-tris(NN-diphenylamino)triphenylamine (abbreviation: TDATA); or 4,4',4''-tris[N-(3-methylphenyl)-N-phenylamino]triphenylamine (abbreviation: MTDATA). Alternatively, an organic material having a carbazole skeleton is preferably used, such as: N-(2-naphthyl)carbazolyl (abbreviation: NCz); 4,4'-di(N-carbazolyl)biphenyl (abbreviation: CBP); 9,10-bis[4-(N-carbazolyl)phenyl]anthracene (abbreviation: BCPA); 3,5-bis[4-(N-carbazolyl)phenyl]biphenyl (abbreviation: BCPBi); or 1,3,5-tris[4-(N-carbazolyl)phenyl]benzene (abbreviation: TCPB). Note that other materials can be used as long as they have a hole transporting property higher than an electron transporting property.

As an inorganic compound included in the layer containing a composite material, transition metal oxide is preferably used, specifically such as titanium oxide, zirconium oxide, hafnium oxide, vanadium oxide, niobium oxide, tantalum oxide, chromium oxide, molybdenum oxide, tungsten oxide, manganese oxide, or rhenium oxide. In particular, vanadium oxide, molybdenum oxide, tungsten oxide, or rhenium oxide is preferably used since each of them has a high electron-accepting property. Above all, molybdenum oxide is preferably used since it is stable even in the atmospheric air and thus is easy to be handled.

Note that the layer containing a composite material included in the light-emitting element of the invention can be manufactured by vapor deposition. Note that molybdenum oxide easily evaporates in vacuum, and thus is preferable in view of the manufacturing process.

The layer containing a composite material included in the light-emitting element of the invention can be manufactured by vapor-depositing an organic compound and an inorganic compound. By periodically changing the concentration ratio of the organic compound to the inorganic compound, conductivity in the stacked direction (thickness direction) can be controlled.

As a method of periodically changing the concentration ratio of the organic compound to the inorganic compound, a substrate, an evaporation source, and a mask may be rotated relative to each other.

For example, by fixing an evaporation source for holding the organic compound and an evaporation source for holding the inorganic compound with a certain distance secured therebetween, and rotating the substrate (self-rotation with a center axis of the substrate), the concentration ratio of the organic compound to the inorganic compound can be changed periodically. The length of one cycle can be changed by controlling the deposition rate and the rotation rate.

In this case, if the rotation rate of the substrate is decreased, one cycle of the periodic change in the concentration ratio of the organic compound to the inorganic compound is lengthened, thereby conductivity in the stacked direction becomes small.

In addition, by fixing the rotation rate of the substrate while increasing the deposition rate of materials from the evaporation sources, one cycle of the periodic change in the concentration ratio of the inorganic compound to the organic compound can be lengthened.

Further, by fixing the evaporation source for holding the organic compound and the evaporation source for holding the inorganic compound with a certain distance secured therebetween, and rotating the substrate by moving it relative to the evaporation sources (orbital rotation of the substrate), the concentration ratio of the organic compound to the inorganic compound can be changed periodically. In this case, by setting the orbital rate of the substrate to be slow, one cycle of the periodic change can be made longer.

In addition, the substrate may be rotated by a combination of the self rotation and the orbital rotation. In this case also, the length of one cycle can be changed by controlling the deposition rate and the rotation rate of the substrate.

Alternatively, by fixing the evaporation sources and the substrate while moving a mask, the concentration ratio of the organic compound to the inorganic compound can be changed periodically. For example, by increasing the rotation rate of the mask, one cycle of the periodic change in the concentration ratio can be shortened. Accordingly, a layer having high conductivity in the stacked direction can be obtained.

Further, the concentration ratio of the organic compound to the inorganic compound can be changed periodically by rotating the evaporation sources while fixing the substrate.

Further, by opening/closing a shutter while fixing the evaporation sources and the substrate, the concentration ratio of the organic compound to the inorganic compound may be periodically changed.

Further, by changing the adsorption rate by changing the temperature of the substrate, the concentration ratio of the organic compound to the inorganic compound may be periodically changed. That is, by changing the adsorption rate by increasing or decreasing the temperature of the substrate, the concentration ratio of the organic compound to the inorganic compound may be changed.

Note that one cycle of the periodic change in the concentration ratio differs depending on the distance between the substrate and the evaporation sources, the distance between the respective evaporation sources, and the like as well as the rotation rate of the substrate and the deposition rate; therefore, the optimal value may be set appropriately for each apparatus.

Figure 18:
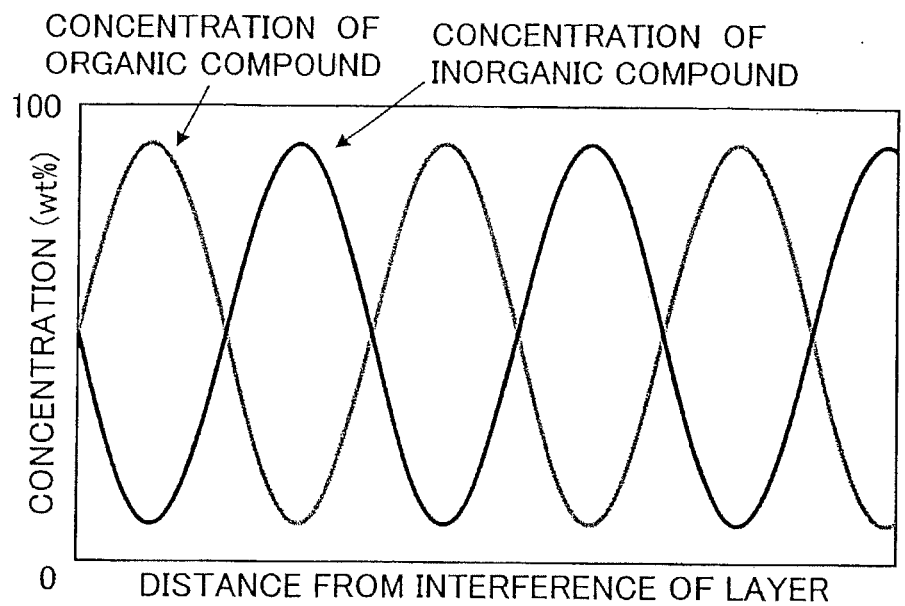
FIG. 18 shows an example of the concentration distribution of a layer containing a composite material.

By using the aforementioned method, a layer having a periodic change in the concentration ratio of an organic compound to an inorganic compound, that is the layer containing a composite material of the invention can be formed. FIG. 18 shows an example of the concentration distribution of the layer containing a composite material of the invention in the depth direction. As shown in FIG. 18, there is an anisotropy in conductivity because concentrations of the organic compound and the inorganic compound change periodically in the depth direction (e.g., stacked direction or thickness direction). The concentration of the inorganic compound is preferably not less than 5 wt % and not more than 90 wt %, and more preferably, not less than 10 wt % and not more than 80 wt %. Meanwhile, the concentration of the organic compound is preferably not less than 10 wt % and not more than 95 wt %, and more preferably, not less than 20 wt % and not more than 90 wt %.

In addition, one cycle of the periodic change in the concentration ratio is preferably not less than 0.5 nm and not more than 30 nm, and more preferably, not less than 1 nm and not more than 10 nm.

By changing the length of one cycle of the periodic change in the concentration ratio of the layer containing a composite material of the invention, desired conductivity can be obtained in the stacked direction. In addition, since the organic compound and the inorganic compound included in the layer containing a composite material are insulators, conductivity as roughly an insulator can be obtained in the surface direction of the layer containing a composite material, which means the conductivity has a constant value. That is, desired conductivity can be obtained in the direction in which the concentration ratio changes periodically (e.g., stacked direction or thickness direction), while the conductivity in the direction in which the concentration ratio does not change periodically (e.g., surface direction) has a constant value, and therefore, there is an anisotropy in conductivity.

Accordingly, the conductivity of the layer containing a composite material can be provided with an anisotropy, unlike a layer having a simple mixture of an organic compound and an inorganic compound.

In addition, crystallization can be suppressed because an organic compound and an inorganic compound are mixed, unlike a case of stacking a layer containing only an organic compound and a layer containing only an inorganic compound.

Further, the layer containing a composite material can be changed in electrical characteristics without changing the composition ratio of the organic compound to the inorganic compound in the layer or changing the kind of compounds used for the layer. Therefore, other characteristics such as the optical characteristics are not changed much. Accordingly, a light-emitting element can be designed and manufactured with redundancy.

(Embodiment Mode 2)

Description is made with reference to FIG. 20 to FIG. 23 on a vapor deposition apparatus used for carrying out the invention, and a method for forming a layer containing a composite material by using the vapor deposition apparatus.

Figure 23:
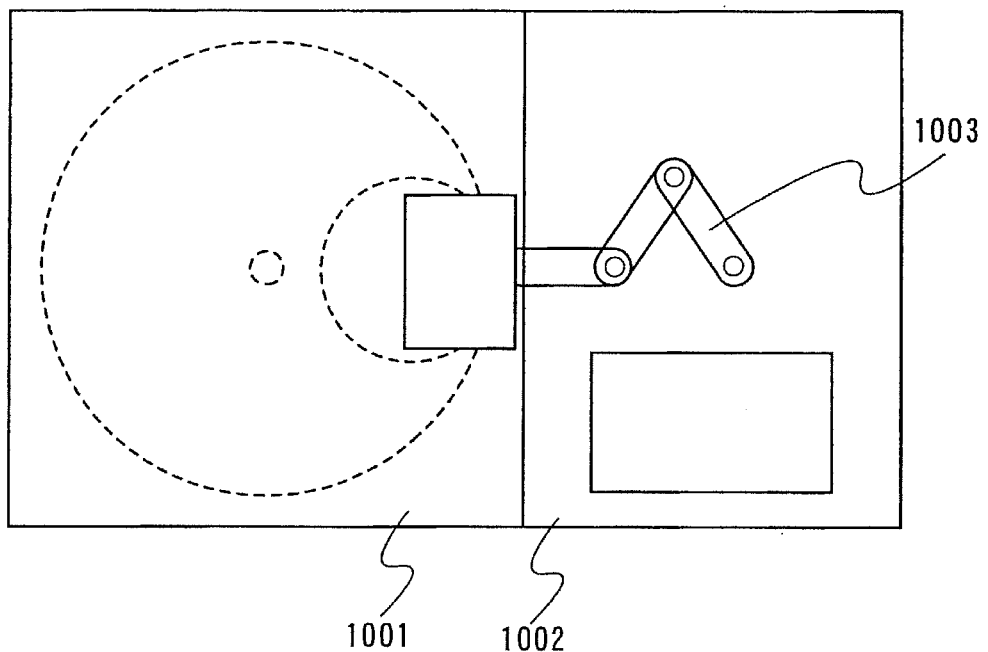
FIG. 23 illustrates a method for manufacturing a light-emitting element of the invention.

A vapor deposition apparatus used for carrying out the invention is provided with a processing chamber 1001 where vapor deposition is performed with respect to an object to be processed, and a transfer chamber 1002. The object to be processed is transferred to the processing chamber 1001 through the transfer chamber 1002. The transfer chamber 1002 is provided with an arm 1003 for transferring the object to be processed (FIG. 23).

Figure 20:
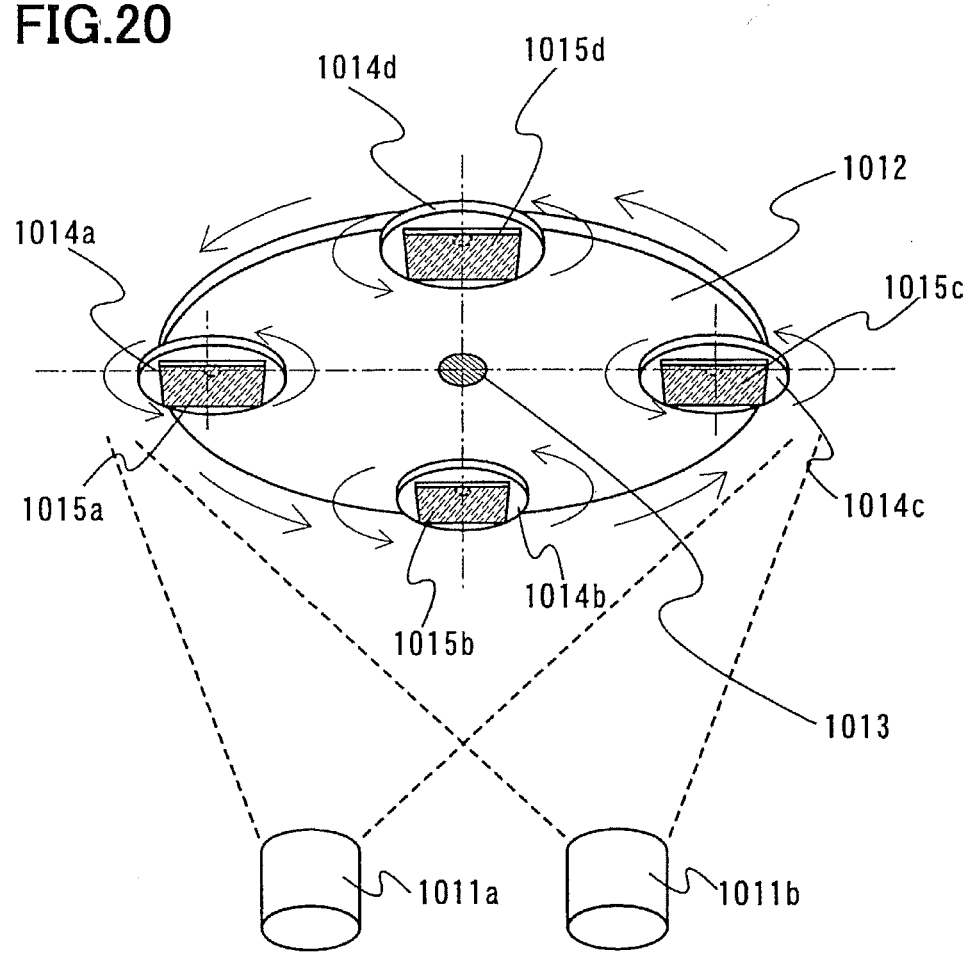
FIG. 20 illustrates a method for manufacturing a light-emitting element of the invention.

Inside the processing chamber 1001, a holding portion for holding the object to be processed, an evaporation source 1011*a* for holding a first material, and an evaporation source 1011*b* for holding a second material are provided as shown in FIG. 20. In FIG. 20, the holding portion for holding the object to be processed is composed of a first rotating plate 1012 which rotates with an axis 1013 as a center, and a plurality of second rotating plates 1014*a* to 1014*d* provided on the first rotating plate 1012. The second rotating plates 1014*a* to 1014*d* rotate with axes provided on the respective second rotating plates 1014*a* to 1014*d* as centers, independently of the axis 1013. Objects to be processed 1015*a* to 1015*d* are held on the second rotating plates 1014*a* to 1014*d* respectively.

In FIG. 20, the second rotating plate 1014*a* holds the object to be processed 1015*a*, the second rotating plate 1014*b* holds the object to be processed 1015*b*, the second rotating plate 1014*c* holds the object to be processed 1015*c*, and the second rotating plate 1014*d* holds the object to be processed 1015*d*.

A layer containing a composite material is formed as follows. First, materials held in the evaporation sources 1011*a* and 1011*b* are heated to sublime. Meanwhile, the first rotating plate 1012 and the second rotating plates 1014*a* to 1014*d* which hold the objects to be processed are rotated. As shown in FIG. 20, when the distance between the object to be processed 1015*a* and the evaporation source 1011*a* is shorter than the distance between the object to be processed 1015*a* and the evaporation source 1011*b*, each material is deposited onto the object to be processed 1015*a* in such a manner that the first material has a higher concentration than the second material. To the contrary, as is seen in the object to be processed 1015*c*, when the distance between the object to be processed 1015*c* and the evaporation source 1011*b* is shorter than the distance between the object to be processed 1015*c* and the evaporation source 1011*a*, each material is deposited onto the object to be processed 1015*c* in such a manner that the second material has a higher concentration than the first material.

Next, when the first rotating plate 1012 is rotated to change the position of the second rotating plate 1014*a* in the processing chamber 1001, the second rotating plate 1014*c* in the position shown in FIG. 20 holds the object to be processed 1015*a*. When the distance between the object to be processed 1015*a* and the evaporation source 1011*b* becomes shorter than the distance between the object to be processed 1015*a* and the evaporation source 1011*a*, each material is deposited onto the object to be processed 1015*a* in such a manner that the second material has a higher concentration than the first material.

In this manner, by changing the position of the objects to be processed 1015*a* to 1015*d* relative to the evaporation sources 1011*a* and 1011*b*, a layer containing a composite material which has a plurality of regions each having a different concentration ratio of materials can be formed on the objects to be processed 1015*a* to 1015*d*. Here, the width of each region in the stacked direction (e.g., thickness direction) included in the layer containing a composite material (length of one cycle of the periodic change in the concentration ratio) may be appropriately changed by controlling the rotation rate of the first rotating plate 1012 and the like.

For example, when the rotation rate of the first rotating plate 1012 is increased, one cycle of the periodic change in the concentration ratio of the first material to the second material becomes shorter, thereby conductivity in the stacked direction is increased.

In addition, by fixing the rotation rate of the first rotating plate 102 while increasing the deposition rate of materials from the evaporation source 1011*a* and the evaporation source 1011*b*, one cycle of the periodic change in the concentration ratio of the first material to the second material can be lengthened.

Note that shapes of the first rotating plate 1012 and the second rotating plates 1014*a* to 1014*d* are not specifically limited, and polygons such as a quadrangle may be employed as well as a circular shape as shown in FIG. 20. In addition, although the second rotating plates 1014*a* to 1014*d* are not necessarily required, the provision of the second rotating plates 1014*a* to 1014*d* will reduce variations in the thickness of a layer formed on the object to be processed, and the like.

Figure 21:
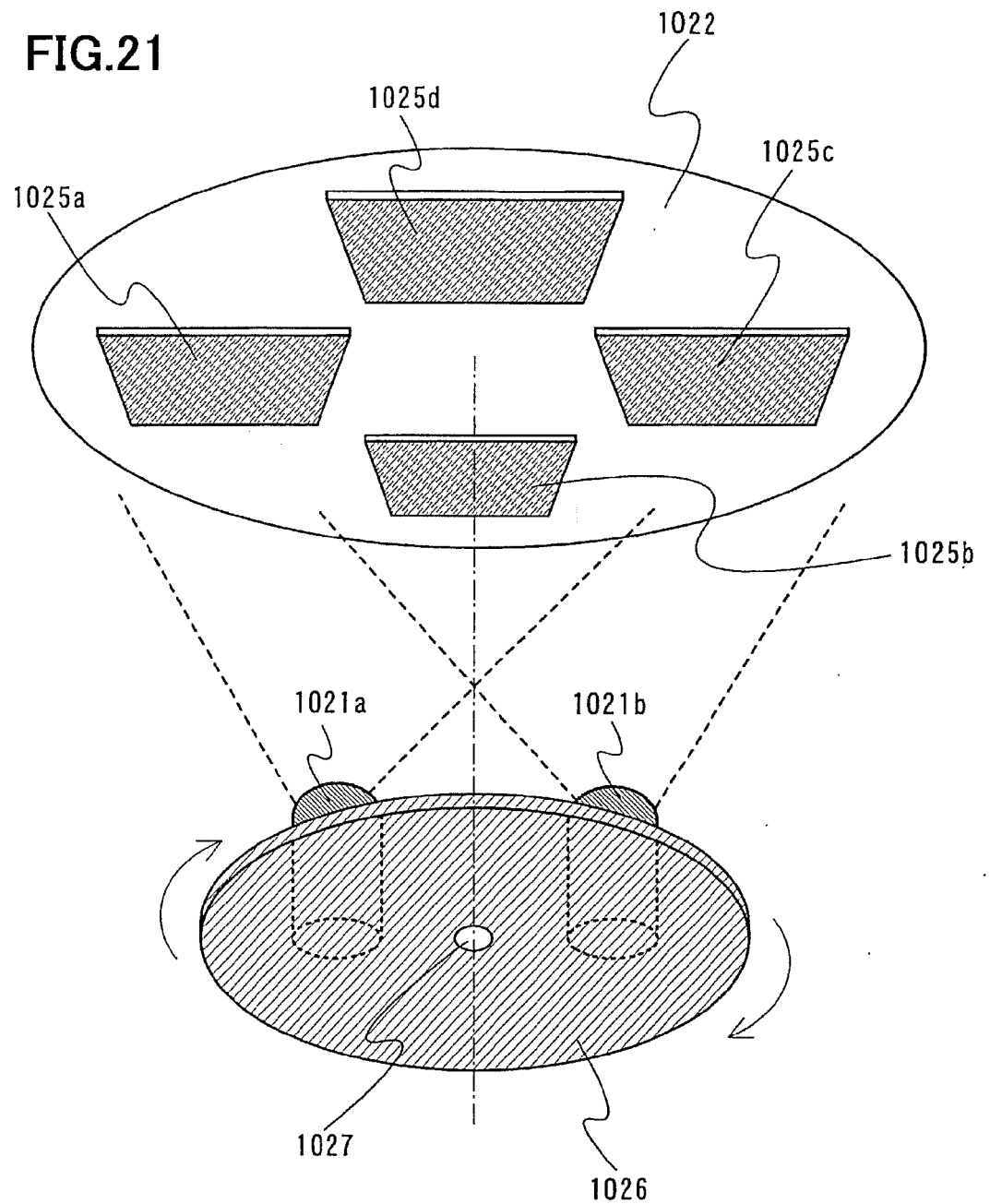
FIG. 21 illustrates a method for manufacturing a light-emitting element of the invention.

The structure of the processing chamber 1001 is not limited to the one shown in FIG. 20, and for example, a structure as shown in FIG. 21 may be employed, where the position of each evaporation source can be changed.

In FIG. 21, evaporation sources 1021*a* and 1021*b* are fixed, and a rotating plate 1026 which rotates with an axis 1027 as a center is provided to face a holding portion 1022 for holding objects to be processed. The holding portion 1022 holds objects to be processed 1025*a* to 1025*d*. The evaporation source 1021*a* holds a first material, while the evaporation source 1021*b* holds a second material. When each evaporation source is located such that the evaporation source 1021*a* is closer to the object to be processed 1025*a* than the evaporation source 1021*b* is, each material is deposited onto the object to be processed 1025*a* in such a manner that the first material has a higher concentration than the second material. Meanwhile, when the rotating plate 1026 is rotated to set the evaporation source 1021*b* to be closer to the object to be processed 1025*a* than the evaporation source 1021*a* is, each material is deposited onto the object to be processed 1025*a* in such a manner that the second material has a higher concentration than the first material. In this manner, the vapor deposition apparatus may have a structure where the position of each evaporation source relative to the object to be processed is changed by changing the position of the evaporation sources. That is, the evaporation sources and the objects to be processed may be provided so that each position changes relative to each other.

In the structure of FIG. 21, when the rotation rate of the evaporation source 1021*a* and the evaporation source 1021*b* is increased, one cycle of the periodic change in the concentration ratio of the first material to the second material becomes shorter, thereby conductivity in the stacked direction is increased.

Figure 22:
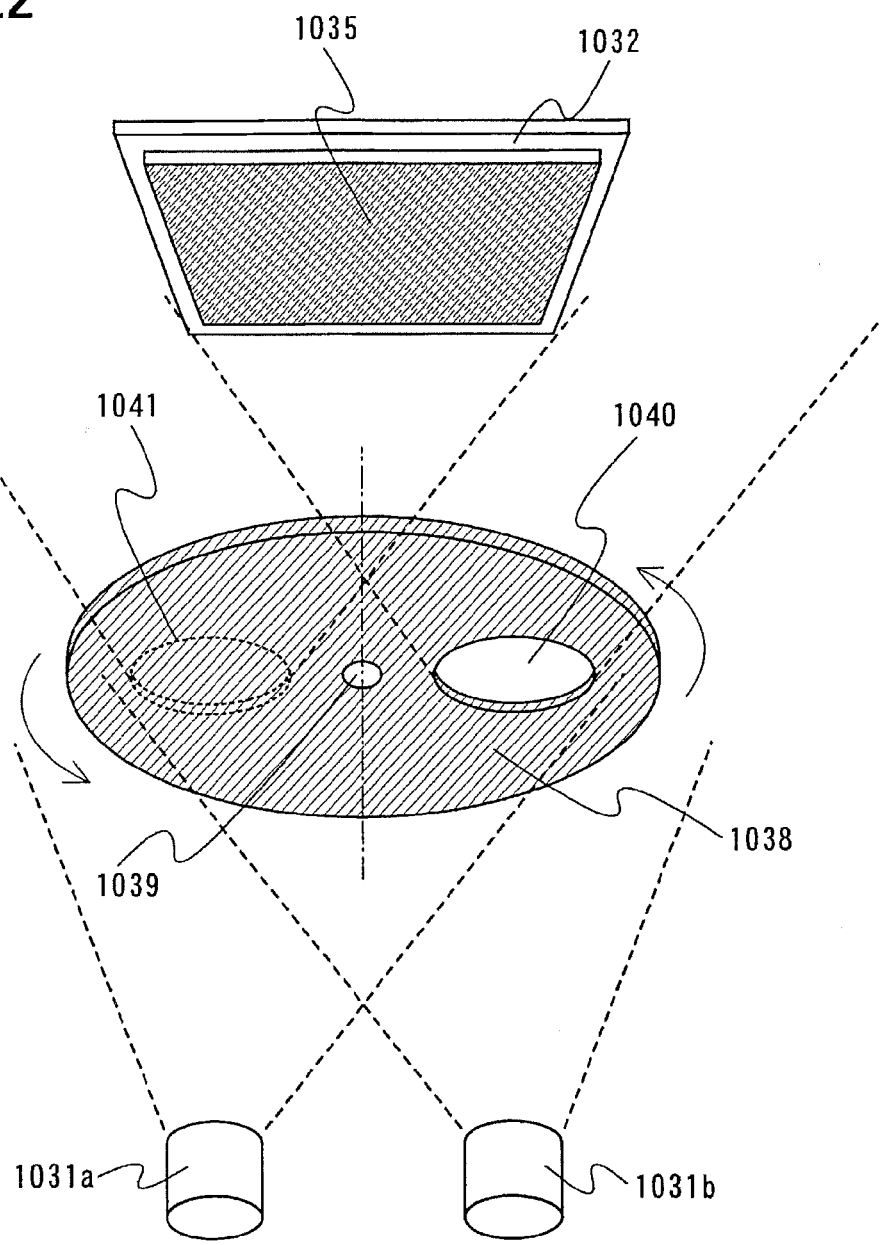
FIG. 22 illustrates a method for manufacturing a light-emitting element of the invention.

In addition to the structures shown in FIG. 20 and FIG. 21, a structure as shown in FIG. 22 may be employed, where a rotating plate functioning as a mask and having an opening is provided between evaporation sources and a holding portion, and the position of the opening of the rotating plate is changed.

In FIG. 22, an evaporation source 1031a for holding a first material and an evaporation source 1031b for holding a second material are provided to face a holding portion 1032 with a rotating plate 1038 having an opening 1040 sandwiched therebetween. The rotating plate 1038 rotates with an axis 1039 as a center so that the position of the opening 1040 changes by rotation. When the opening 1040 is positioned closer to the evaporation source 1031a than the evaporation source 1031b, gas is diffused in the direction of the holding portion 1032 through the opening 1040 with the condition that the first material has a higher concentration than the second material, thereby each material is deposited onto an object 1035 to be processed held by the holding portion 1032 so that the first material has a higher concentration than the second material. Meanwhile, when the rotating plate 1038 is rotated to set the opening 1040 to be closer to the evaporation source 1031b than the evaporation source 1031a (e.g., if the opening is set as indicated by a dashed line 1041), each material is deposited onto the object to be processed 1035 in such a manner that the second material has a higher concentration than the first material.

In the structure shown in FIG. 22, when the rotation rate of the rotating plate 1038 is increased, one cycle of the periodic change in the concentration ratio of the first material to the second material becomes shorter, thereby conductivity in the stacked direction is increased.

In this manner, by changing the relative positions of the evaporation sources and the object to be processed to each other, a layer containing a composite material can be formed. In addition to the evaporation sources, by changing the relative positions of the opening provided in the rotating plate functioning as a mask and the object to be processed to each other, a layer containing a composite material can be formed.

Note that the structure of the vapor deposition apparatus is not limited to the one shown in FIG. 23, and for example, a structure having a sealing chamber for sealing a light-emitting element may be employed. In addition, the number of the processing chambers for performing vapor deposition does not have to be one, and two or more processing chambers may be provided.

(Embodiment Mode 3)

A light-emitting element of the invention has a plurality of layers between a pair of electrodes. The plurality of layers are formed by stacking layers each formed of a substance with a high carrier injection property or a high carrier transporting property so that a light-emitting region is provided away from the electrodes, that is, carriers may be recombined in a portion away from the electrodes.

Description is made below with reference to FIG. 1A on one mode of the light-emitting element of the invention.

In this embodiment, the light-emitting element is formed by stacking a first electrode 102, a first layer 103, a second layer 104, a third layer 105, a fourth layer 106, and a second electrode 107 in this order. Note that in this embodiment mode, description is made below on the assumption that the first electrode 102 functions as an anode while the second electrode 107 functions as a cathode.

A substrate 101 is used as a support of the light-emitting element. The substrate 101 may be formed by using glass, plastic or the like, for example. Note that other materials may be used as long as they can function as a support of the light-emitting element in the manufacturing process.

The first electrode 102 may be formed by using various metals, alloys, electrically conductive compounds, or a mixture of such materials. For example, the first electrode 102 may be formed by using indium tin oxide (ITO); indium tin oxide containing silicon; IZO (Indium Zinc Oxide) obtained by mixing indium oxide with 2 to 20 wt % of zinc oxide (ZnO); or indium oxide containing 0.5 to 5 wt % of tungsten oxide and 0.1 to 1 wt % of zinc oxide (IWZO). Alternatively, the first electrode 102 may be formed by using gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), nitride of a metal material such as TiN, or the like.

The first layer 103 is a layer containing a composite material shown in Embodiment Mode 1. That is, the first layer 103 is a layer containing an organic compound and an inorganic compound, where the concentration ratio of the organic compound to the inorganic compound changes periodically.

The second layer 104 is a layer formed of a substance with a high hole transporting property, for example, an aromatic amine compound (i.e., having benzene ring-nitrogen bonds) such as 4,4'-bis[N-(1-naphthyl)-N-phenylamino]biphenyl (abbreviation: a-NPD); N,N'-dipheny-N,N'-bis(3-methylphenyl)-1,1'-biphenyl-4,4'-diamine (abbreviation: TPD); 4,4',4''-tris(N,N-diphenylamino)triphenylamine (abbreviation: TDATA); or 4,4',4''-tris[N-(3-methylphenyl)-N-phenylamino]triphenylamine (abbreviation: MTDATA). Each substance described herein mainly has a hole mobility of $10^{-6}$ cm$^2$/Vs or higher. Note that other materials may be used as long as they have a hole transporting property higher than an electron transporting property. Note that the second layer 104 is not limited to a single layer, but may be a stacked layer having two or more layers formed of the aforementioned substances.

The third layer 105 is a layer containing a substance with a high light-emitting property. For example, the third layer 105 is formed by freely combining a substance with a high light-emitting property such as N,N'-dimethylquinacridone (abbreviation: DMQd); or 3-(2-benzothiazolyl)-7-diethylaminocoumarin (abbreviation: coumarin 6); and a substance with a high carrier transporting property and thus is not easily crystallized such as tris(8-quinolinolato)aluminum (abbreviation: Alq$_3$); or 9,10-di(2-naphthyl)anthracene (abbreviation: DNA). Note that since Alq$_3$ and DNA also have a high light-emitting property, such substance may be formed in a single layer to be used as the third layer 105.

The fourth layer 106 is a layer having a high electron transporting property, for example, a metal complex having a quinoline skeleton or a benzoquinoline skeleton such as tris (8-quinolinolato) aluminum (abbreviation: Alq$_3$); tris(4-methyl-8-quinolinolato)aluminum (abbreviation: Almq$_3$); bis (10-hydroxybenzo[h]quinolinato)beryllium (abbreviation: BeBq$_2$); or bis(2-methyl-8-quinolinolato)(4-phenylphenolato)aluminum (abbreviation: BAlq). Alternatively, a metal complex having an oxazole ligand or a thiazole ligand may be used such as bis[2-(2'-hydroxyphenyl)benzoxazolato]zinc (abbreviation: Zn(BOX)$_2$); or bis[2-(T-hydroxyphenyl)benzothiazolato]zinc (abbreviation: Zn(BTZ)$_2$). Alternatively, other than such metal complex, the following can be used: 2-(4-biphenyl)-5-(4-tert-butylphenyl)-1,3,4-oxadiazole (abbreviation: PBD); 1,3-bis[5-(4-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ); 3-(4-biphenylyl)-4-(4-ethylphenyl)-5-(4-tert-butylphenyl)-1,2,4-triazole (abbreviation: p-EtTAZ); bathophenanthroline (abbreviation: BPhen); bathocuproin (abbreviation: BCP); or the like. Each substance described herein mainly has an electron mobility of $10^6$ cm$^2$/Vs or higher. Note that other materials may be used as long as they have an electron transporting property higher than a hole transporting property. Note that the fourth layer 106 is not limited to a single layer, but may be a stacked layer having two or more layers formed of the aforementioned substances.

The second electrode 107 may be formed of a material with a high work function (3.8 eV or lower) such as a metal, an alloy, an electrically conductive compound, or a mixture of them. As a specific example of such cathode material, there are metals belonging to the group 1 or 2 of the periodic table, namely alkaline metals such as lithium (Li) or cesium (Cs), alkaline earth metals such as magnesium (Mg), calcium (Ca), or strontium (Sr), or alloys containing such metals (MgAg or AlLi). However, by providing a layer having a function to promote electron injection on the second electrode 107 so as to be located between the second electrode 107 and the light-emitting layer, various conductive materials can be used as the second electrode 107 regardless of the value of the work function, such as Al, Ag, ITO, or ITO containing silicon.

Note that the layer having a function to promote electron injection includes a compound of alkaline metals such as lithium fluoride (LiF) or cesium fluoride (CsF) or a compound of alkaline earth metals such as calcium fluoride (CaF$_2$). Alternatively, the second electrode 107 may be formed with a layer formed of a substance having an electron transporting property into which an alkaline metal or an alkaline earth metal is mixed, for example by mixing magnesium (Mg) into Alq$_3$.

The second layer 104, the third layer 105, and the fourth layer 106 may be formed by a known method such as vapor deposition, ink-jet deposition, or spin coating. In addition, different deposition methods may be used for forming the respective electrodes or layers.

In the light-emitting element of the invention having the aforementioned structure, current flows by a potential difference generated between the first electrode 102 and the second electrode 107, thereby holes and electrons are recombined in the third layer 105 as a layer containing a substance with a high light-emitting property, and thus light emission is obtained. That is, a light-emitting region is formed in the third layer 105. Note that not the whole region of the third layer 105 is required to function as a light-emitting region, but a light-emitting region may be formed, for example, only in a part of the third layer 105 which is closer to the second electrode 104 or the fourth layer 106.

Figure 1B:
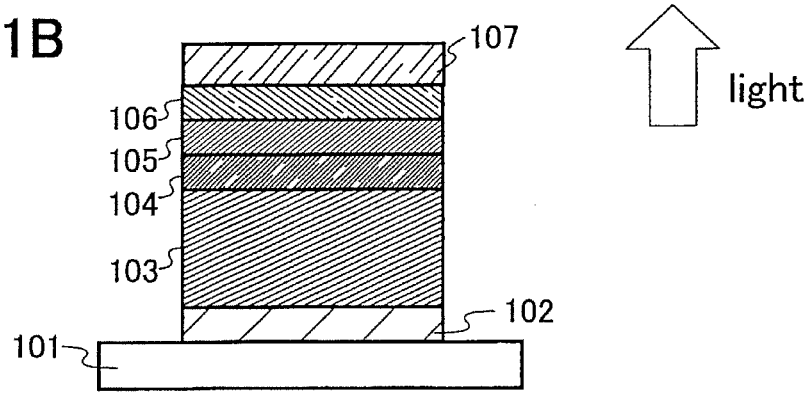
Figure 1C:
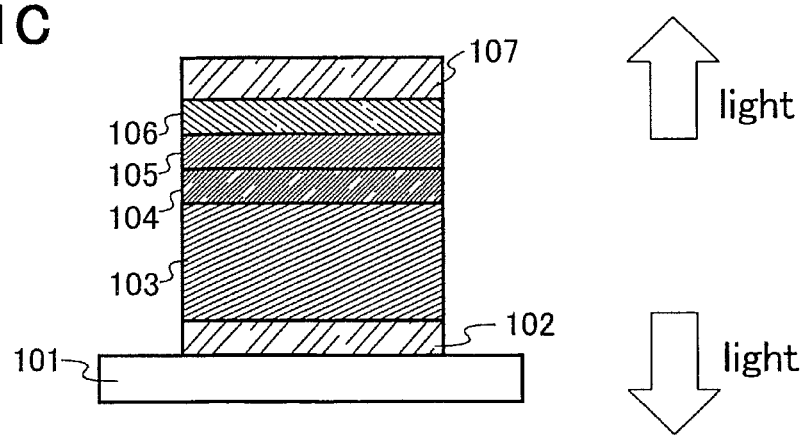

Light emission is extracted to the outside through one or both of the first electrode 102 and the second electrode 107. Accordingly, one or both of the first electrode 102 and the second electrode 107 is formed of a light-transmissive substance. In the case where only the first electrode 102 is formed of a light-transmissive substance, light is emitted from the substrate side through the first electrode 102 as shown in FIG. 1A. Alternatively, in the case where only the second electrode 107 is formed of a light-transmissive substance, light is emitted from the opposite side of the substrate through the second electrode 107 as shown in FIG. 1B. Further alternatively, in the case where both the first electrode 102 and the second electrode 107 are formed of a light-transmissive substance, light is emitted from both the substrate side and the opposite side of the substrate through the first electrode 102 and the second electrode 107 as shown in FIG. 1C.

Note that the structure of the layers provided between the first electrode 102 and the second electrode 107 is not limited to the aforementioned. Any other structure may be employed as long as a region for recombining holes and electrodes is provided away from the first electrode 102 and the second electrode 107 in order to prevent light quenching which would be caused when the light-emitting region is located close to a metal, and a layer containing a composite material as shown in Embodiment Mode 1 is provided.

That is, the stacked structure of the layers is not specifically limited, and a layer containing a composite material of the invention may be freely combined with a layer formed of a substance with a high electron transporting property, a substance with a high hole transporting property, a substance with a high electron injection property, a substance with a high hole injection property, a substance with a high bipolar property (substance with both a high electron transporting property and a hole transporting property), and the like. In addition, a layer formed of a silicon oxide film or the like may be provided over the first electrode 102 in order to control a portion for recombining carriers.

Figure 2:
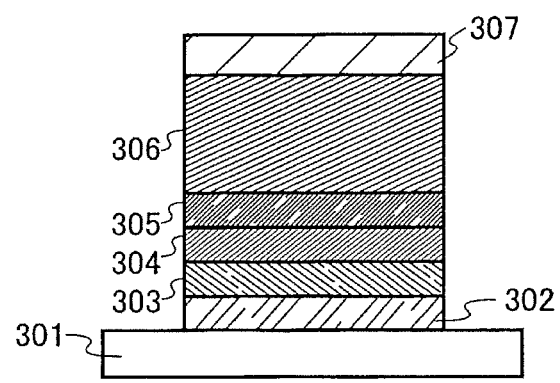
FIG. 2 illustrates a light-emitting element of the invention.

The light-emitting element shown in FIG. 2 has a structure where a first electrode 302 functioning as a cathode, a first layer 303 formed of a substance with a high electron transporting property, a second layer 304 containing a substance with a high light-emitting property, a third layer 305 with a high hole transporting property, a fourth layer 306 as a layer containing a composite material of the invention, and a second electrode 307 functioning as an anode are stacked in this order. Note that reference numeral 301 denotes a substrate.

In this embodiment mode, a light-emitting element is formed over a substrate made of glass, plastic or the like. By forming a plurality of such light-emitting elements over a substrate, a passive matrix light-emitting device can be manufactured. Alternatively, the light-emitting elements may be formed over a substrate having a thin film transistor (TFT) array as well as the aforementioned substrate made of glass, plastic or the like. Accordingly, an active matrix light-emitting device can be manufactured, where drive of light-emitting elements is controlled with TFTs. Note that the structure of each TFT is not specifically limited. It may be staggered TFT or an inversely staggered TFT. As for a driver circuit formed on the TFT array substrate also, one or both of n-channel transistors and p-channel transistors may be used.

The light-emitting element of the invention has a layer containing a composite material as shown in Embodiment Mode 1. Therefore, the layer containing a composite material can be changed in electrical characteristics by changing the length of one cycle of the periodic change in the concentration ratio of the organic compound to the inorganic compound included in the layer containing a composite material. That is, electrical characteristics can be changed without changing the composition ratio of the organic compound to the inorganic compound in the layer or changing the kind of compounds used for the layer. Therefore, other characteristics such as the optical characteristics are not changed much. Accordingly, a light-emitting element can be designed and manufactured with redundancy.

In addition, since the layer containing a composite material of the invention has high conductivity in the stacked direction, the driving voltage of the light-emitting element can be decreased. Meanwhile, since the conductivity in the surface direction is low, cross talk which would be generated between adjacent light-emitting elements can be suppressed.

In addition, since the layer containing a composite material of the invention has high conductivity in the stacked direction, the driving voltage of the light-emitting element can be prevented from increasing even when the layer containing a composite material is formed thick.

In addition, since the layer containing a composite material can be formed to have a desired thickness, the color purity and the light extraction efficiency can be increased by optical designs without the need for increasing the driving voltage of the light-emitting element.

Further, since the increased thickness of the layer containing a composite material can prevent short circuit due to dust, shocks, and the like, a light-emitting element with high reliability can be obtained. For example, although layers between a pair of electrodes of a general light-emitting element have a thickness of 100 to 150 nm, layers (including a layer containing a composite material) between a pair of electrodes of a light-emitting element of the invention can be formed to have a thickness of 100 to 500 nm, or preferably 200 to 500 nm.

A layer containing a composite material used for a light-emitting element of the invention is capable of having an ohmic contact with an electrode; therefore, contact resistance with the electrode is low. Thus, electrode materials can be selected without considering the work function or the like. That is, the selection range of the electrode materials can be widened.

(Embodiment Mode 4)

In this embodiment mode, description is made with reference to FIGS. 5A to 5C and FIGS. 6A to 6C on a light-emitting element having a different structure than that shown in Embodiment Mode 3. In the structure shown in this embodiment mode, a layer containing a composite material of the invention can be provided so as to be in contact with an electrode functioning as a cathode.

Figure 5A:
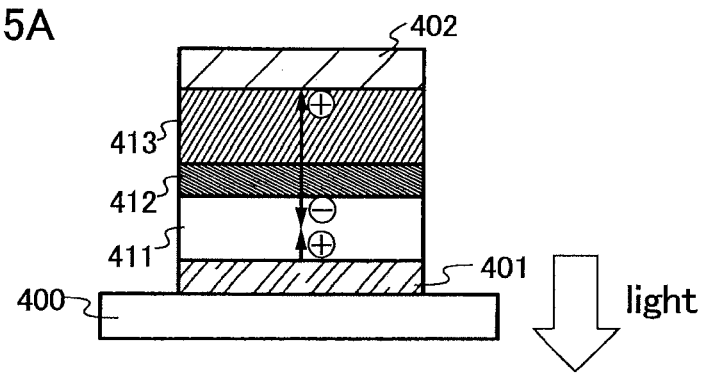
FIGS. 5A to 5C illustrate light-emitting elements of the invention.

FIG. 5A shows an example of a structure of the light-emitting element of the invention. A first layer 411, a second layer 412, and a third layer 413 are stacked in this order, which are sandwiched between a first electrode 401 and a second electrode 402. This embodiment mode illustrates a case where the first electrode 401 functions as an anode while the second electrode 402 functions as a cathode.

The first electrode 401 and the second electrode 402 may have the same structure as that of Embodiment Mode 3. In addition, the first layer 411 is a layer containing a substance with a high light-emitting property. The second layer 412 is a layer containing a compound selected from among electron-donating substances and also containing a compound with a high electron transporting property, while the third layer 413 is a layer containing a composite material shown in Embodiment Mode 1. An electron-donating substance contained in the second layer 412 is preferably an alkaline metal, an alkaline earth metal, oxide thereof, or salt. Specifically, there are lithium, cesium, calcium, lithium oxide, calcium oxide, barium oxide, cesium carbonate, and the like.

With such a structure, electrons are given/received in the vicinity of an interface between the second layer 412 and the third layer 413 by applying a voltage as shown in FIG. 5A, and electrons and holes are generated. At this time, the second layer 412 transports electrons to the first layer 411 while the third layer 413 transports holes to the second electrode 402. That is, the second layer 412 and the third layer 413 jointly function as a carrier generating layer. In addition, the third layer 413 also has a function to transport holes to the second electrode 402.

The third layer 413 has high conductivity in the stacked direction while having low conductivity in the surface direction. Accordingly, the driving voltage of the light-emitting element can be decreased. In addition, cross talk which would be generated between adjacent light-emitting elements can be suppressed. Further, even in the case where the third layer 413 is formed thick, the driving voltage of the light-emitting element can be prevented from increasing.

Since the driving voltage of the light-emitting element can be prevented from increasing even if the third layer 413 is formed thick, the thickness of the third layer 413 can be freely set and the extraction efficiency of light emitted from the first layer 411 can be increased. In addition, the thickness of the third layer 413 may be set so as to improve the color purity of light emitted from the first layer 411.

Further, the increased thickness of the third layer 413 can prevent short circuit due to dust, shocks, and the like.

When taking FIG. 5A for instance, if the second electrode 402 is deposited by sputtering, damages caused to the first layer 411 containing a light-emissive substance can be decreased.

Note that the light-emitting element of this embodiment mode may also have a variety of structures by changing the materials of the first electrode 401 and the second electrode 402. FIGS. 5B and 5C and FIGS. 6A to 6C show the schematic views thereof. Note that the same reference numerals as those in FIG. 5A are used in FIGS. 5B and 5C and FIGS. 6A to 6C. Reference numeral 400 denotes a substrate for supporting the light-emitting element of the invention.

Figure 5B:
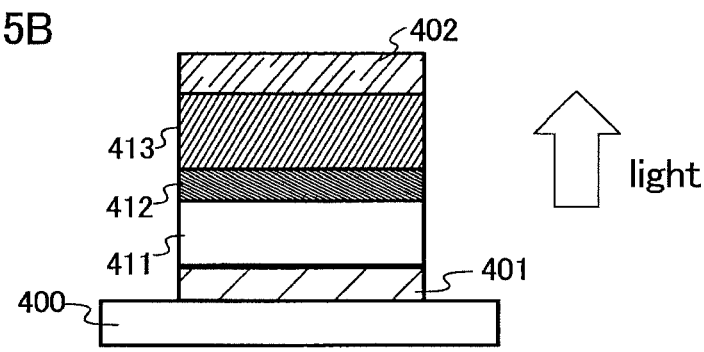
Figure 5C:
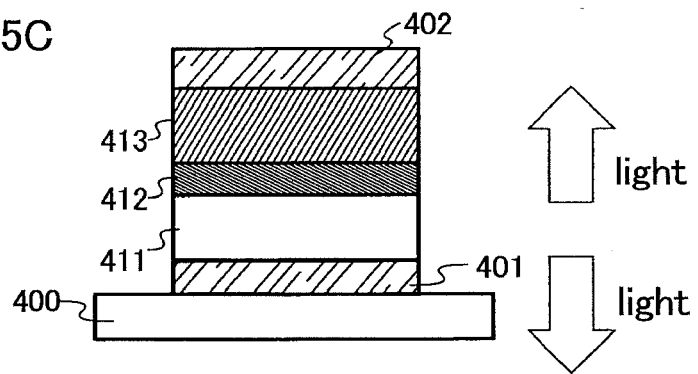

FIGS. 5A to 5C show examples where the first layer 411, the second layer 412, and the third layer 413 are formed in this order over the substrate 400. When forming the first electrode 401 to transmit light, and forming the second electrode 402 to shield light (reflect light, in particular), light can be emitted from the substrate 400 side as shown in FIG. 5A. When forming the first electrode 401 to shield light (reflect light, in particular), and forming the second electrode 402 to transmit light, light can be emitted from the opposite side of the substrate 400 as shown in FIG. 5B. Further, when forming both of the first electrode 401 and the second electrode 402 to transmit light, light can be emitted from both of the substrate 400 side and the opposite side thereof as shown in FIG. 5C.

Figure 6A:
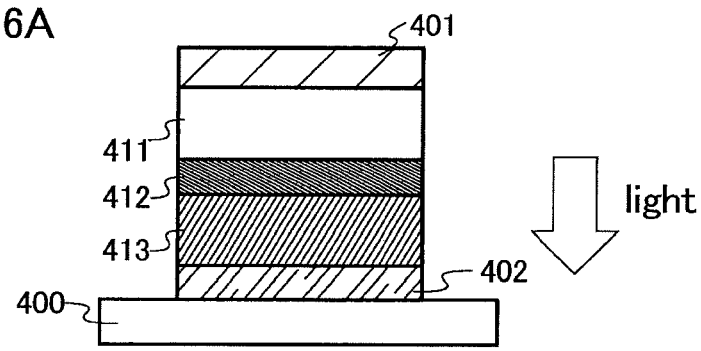
FIGS. 6A to 6C illustrate light-emitting elements of the invention.
Figure 6B:
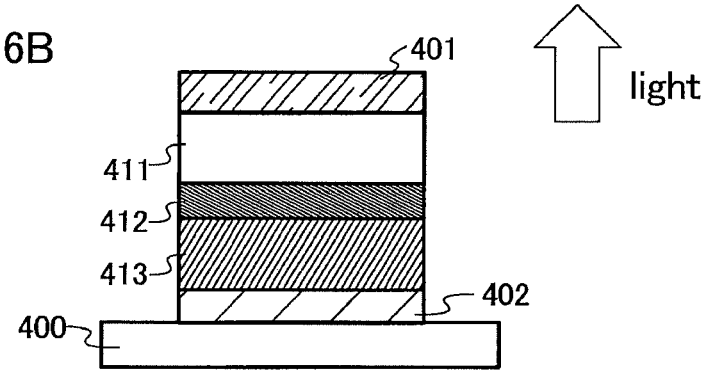
Figure 6C:
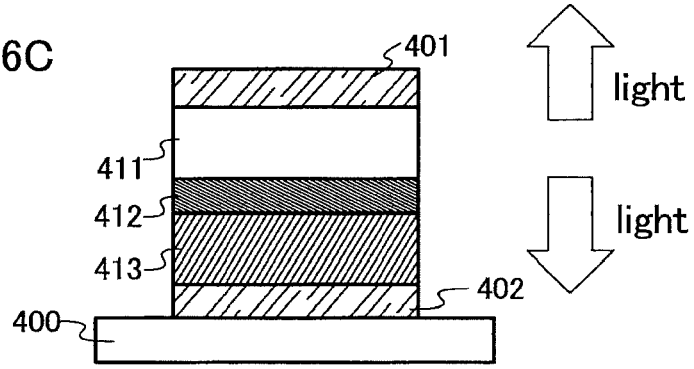

FIGS. 6A to 6C show examples where the third layer 413, the second layer 412 and the first layer 411 are formed over the substrate 400. When forming the first electrode 401 to shield light (reflect light, in particular), and forming the second electrode 402 to transmit light, light can be emitted from the substrate 400 side as shown in FIG. 6A. When forming the first electrode 401 to transmit light, and forming the second electrode 402 to shield light (reflect light, in particular), light can be emitted from the opposite side of the substrate 400 as shown in FIG. 6B. Further, when forming both of the first electrode 401 and the second electrode 402 to transmit light, light can be emitted from both of the substrate 400 side and the opposite side thereof as shown in FIG. 6C.

Note that the light-emitting element in this embodiment mode can be manufactured by a known method regardless of a wet method process or a dry process. However, the layer containing a composite material is preferably formed by the method shown in Embodiment Mode 1 or Embodiment Mode 2.

In addition, the light-emitting emitting element may be formed either in a manner shown in FIGS. 5A to 5C where the first electrode 401, the first layer 411, the second layer 412, the third layer 413, and the second electrode 402 are stacked in this order, or in a manner shown in FIGS. 6A to 6C where the second electrode 402, the third layer 413, the second layer 412, the first layer 411, and the first electrode 401 are stacked in this order.

The light-emitting element of the invention has a layer containing a composite material shown in Embodiment Mode 1. Therefore, the layer containing a composite material can be changed in electrical characteristics by changing the length of one cycle of the periodic change in the concentration ratio of an organic compound to an inorganic compound included in the layer containing a composite material. That is, the electrical characteristics can be changed without changing the composition ratio of the organic compound to the inorganic compound in the layer or changing the kind of compounds used for the layer. Therefore, other characteristics such as the optical characteristics are not changed much. Accordingly, a light-emitting element can be designed and manufactured with redundancy.

Note that this embodiment mode can be appropriately implemented in combination with other embodiment modes.

(Embodiment Mode 5)

Description is made with reference to FIGS. 3A to 3C and FIGS. 4A to 4C on a light-emitting element having a different structure than those shown in Embodiment Mode 3 and Embodiment Mode 4. In the structure shown in this embodiment mode, layers each containing a composite material can be provided so as to be in contact with two electrodes of a light-emitting element respectively.

Figure 3A:
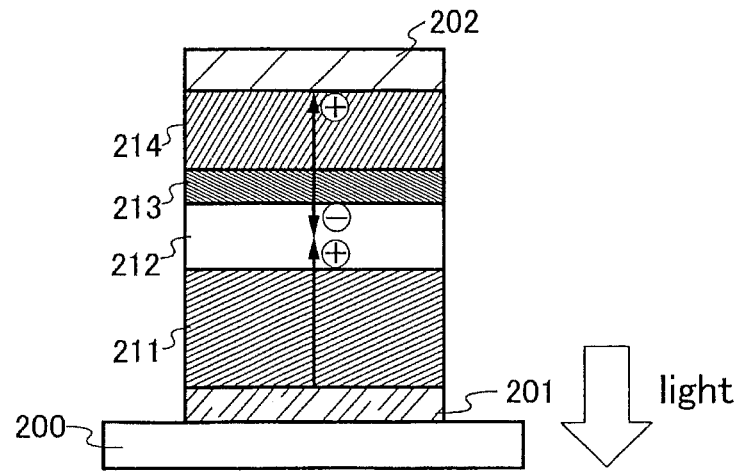
FIGS. 3A to 3C illustrate light-emitting elements of the invention.

FIG. 3A shows an example of a structure of the light-emitting element of the invention. A first layer 211, a second layer 212, a third layer 213, and a fourth layer 214 are stacked in this order, which are sandwiched between a first electrode 201 and a second electrode 202. This embodiment mode illustrates a case where the first electrode 201 functions as an anode while the second electrode 202 functions as a cathode.

The first electrode 201 and the second electrode 202 may have the same structure as that of Embodiment Mode 3. In addition, the first layer 211 is a layer containing a composite material shown in Embodiment Mode 1, and the second layer 212 is a layer containing a substance with a high light-emitting property. The third layer 213 is a layer containing a high electron-donating substance and a compound having a high electron transporting property, and the fourth layer 214 is a layer containing a composite material shown in Embodiment Mode 1. An electron-donating substance contained in the third layer 213 is preferably an alkaline metal, an alkaline earth metal, oxide thereof, or salt. Specifically, there are lithium, cesium, calcium, lithium oxide, calcium oxide, barium oxide, cesium carbonate, and the like.

With such a structure, electrons are given/received in the vicinity of an interface between the third layer 213 and the fourth layer 214 by applying a voltage as shown in FIG. 3A, and electrons and holes are generated. At this time, the third layer 213 transports electrons to the second layer 212 while the fourth layer 214 transports holes to the second electrode 202. That is, the third layer 213 and the fourth layer 214 jointly function as a carrier generating layer. In addition, the fourth layer 214 also has a function to transport holes to the second electrode 202. Note that by providing another set of the second layer and the third layer between the fourth layer 214 and the second electrode 202, a tandem light-emitting element can be formed.

Each of the first layer 211 and the fourth layer 214 has high conductivity in the stacked direction while having low conductivity in the surface direction. Accordingly, the driving voltage of the light-emitting element can be decreased. In addition, cross talk which would be generated between adjacent light-emitting elements can be suppressed. Further, even in the case of forming the first layer 211 and the fourth layer 214 to be thick, the driving voltage of the light-emitting element can be prevented from increasing.

Since the driving voltage of the light-emitting element can be prevented from increasing even if the first layer 211 and the fourth layer 214 are formed thick, the thickness of the first layer 211 and the fourth layer 214 can be freely set, and the extraction efficiency of light emitted from the second layer 212 can be improved. In addition, the thickness of the first layer 211 and the fourth layer 214 may be set so as to improve the color purity of light emitted from the second layer 212.

Since the first layer 211 and the fourth layer 214 have high transmissivity of visible light, decrease in the extraction efficiency of light to the outside can be suppressed regardless of the increased thickness of the first layer 211 and the fourth layer 214.

In the light-emitting element of this embodiment mode, layers between the second layer having a light-emitting function and the anode, and layers between the second layer and the cathode can be formed quite thick; therefore, short circuit of the light-emitting element can be effectively prevented. When taking FIG. 3A for instance, if the second electrode 202 is deposited by sputtering, damages caused to the second layer 212 containing a light-emissive substance can be reduced. Further, by forming the first layer 211 and the fourth layer 214 by using the same material, layers formed of the same material can be provided on opposite sides of the layer having a light-emitting function; therefore, distortion due to stress can be suppressed.

Note that the light-emitting element of this embodiment mode may also have a variety of structures by changing the materials of the first electrode 201 and the second electrode 202.

FIGS. 3B and 3C and FIGS. 4A to 4C show the schematic views thereof. Note that the same reference numerals as those in FIG. 3A are used in FIGS. 3B and 3C and FIGS. 4A to 4C. Reference numeral 200 denotes a substrate for supporting a light-emitting element of the invention.

Figure 3B:
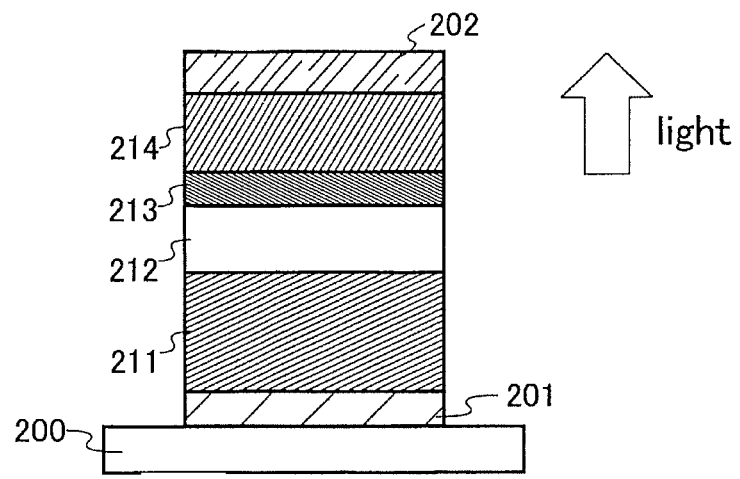
Figure 3C:
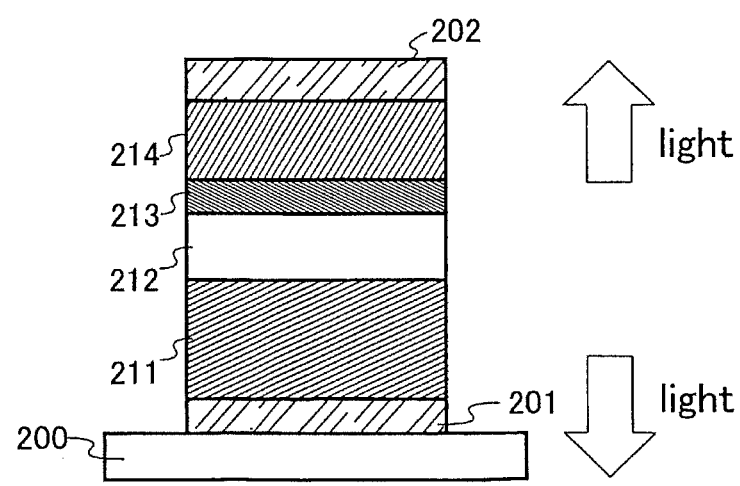

FIGS. 3A to 3C show examples where the first layer 211, the second layer 212, the third layer 213, and the fourth layer 214 are formed in this order over the substrate 200. When forming the first electrode 201 to transmit light, and forming the second electrode 202 to shield light (reflect light, in particular), light can be emitted from the substrate 200 side as shown in FIG. 3A. When forming the first electrode 201 to shield light (reflect light, in particular), and forming the second electrode 202 to transmit light, light can be emitted from the opposite side of the substrate 200 as shown in FIG. 3B. Further, when forming both of the first electrode 201 and the second electrode 202 to transmit light, light can be emitted from both of the substrate 200 side and the opposite side thereof as shown in FIG. 3C.

Figure 4A:
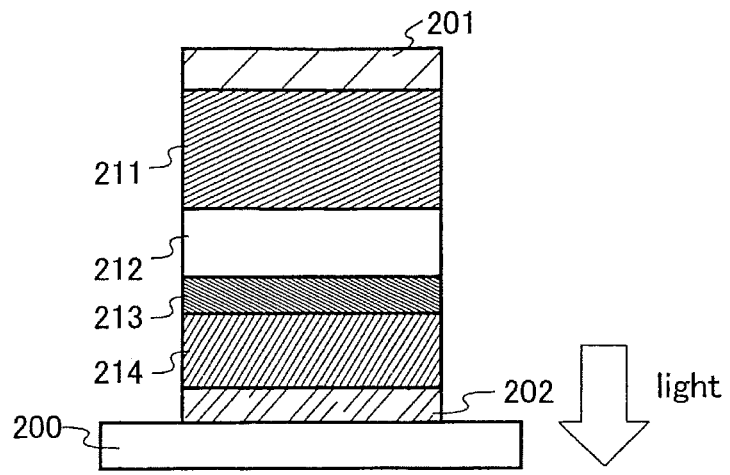
FIGS. 4A to 4C illustrate light-emitting elements of the invention.
Figure 4B:
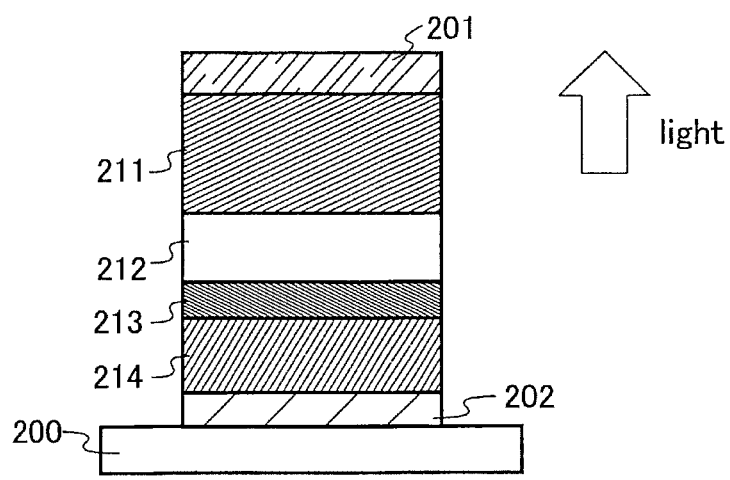
Figure 4C:
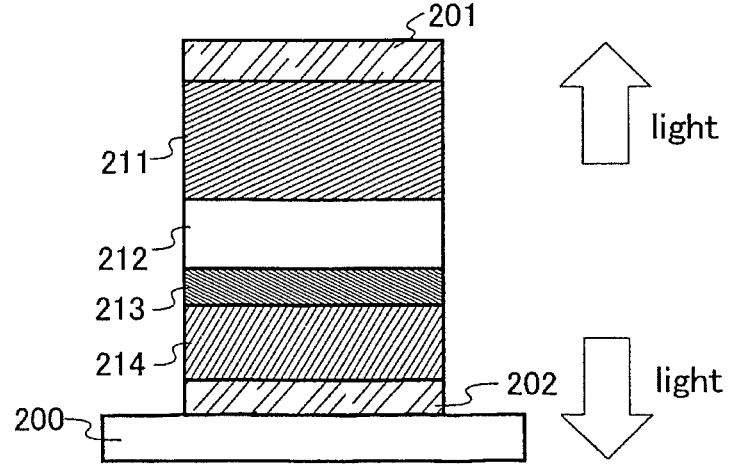

FIGS. 4A to 4C show examples where the fourth layer 214, the third layer 213, the second layer 212, and the first layer 211 are formed in this order over the substrate 200. When forming the first electrode 201 to shield light (reflect light, in particular), and forming the second electrode 202 to transmit light, light can be emitted from the substrate 200 side as shown in FIG. 4A. When forming the first electrode 201 to transmit light, and forming the second electrode 202 to shield light (reflect light, in particular), light can be emitted from the opposite side of the substrate 200 as shown in FIG. 4B. Further, when forming both of the first electrode 201 and the second electrode 202 to transmit light, light can be emitted from both of the substrate 200 side and the opposite side thereof as shown in FIG. 4C.

Note that such a structure can also be employed that the first layer 211 is a layer containing a compound selected from among electron-donating substances and also containing a compound with a high electron transporting property, the second layer 212 is a layer containing a light-emissive substance, the third layer 213 is a layer containing a composite material shown in Embodiment Mode 1, and the fourth layer 214 is a layer containing a compound selected from among electron-donating substances and also containing a compound with a high electron transporting property.

Note that the light-emitting element of this embodiment mode can be manufactured by a known method regardless of a wet method process or a dry process. However, the layer containing a composite material is preferably formed by the method shown in Embodiment Mode 1 or Embodiment Mode 2.

In addition, the light-emitting emitting element may be formed either in a manner shown in FIGS. 3A to 3C where the first electrode 201, the first layer 211, the second layer 212, the third layer 213, the fourth layer 214, and the second electrode 202 are stacked in this order, or in a manner shown in FIGS. 4A to 4C where the second electrode 202, the fourth layer 214, the third layer 213, the second layer 212, the first layer 211, and the first electrode 201 are stacked in this order.

The light-emitting element of the invention has a layer containing a composite material shown in Embodiment Mode 1. Therefore, the layer containing a composite material can be changed in electrical characteristics by changing the length of one cycle of the periodic change in the concentration ratio of an organic compound to an inorganic compound included in the layer containing a composite material. That is, the electrical characteristics can be changed without changing the composition ratio of the organic compound to the inorganic compound in the layer or changing the kind of compounds used for the layer. Therefore, other characteristics such as the optical characteristics are not changed much. Accordingly, a light-emitting element can be designed and manufactured with redundancy.

Note that this embodiment mode can be appropriately implemented in combination with other embodiment modes.
(Embodiment Mode 6)

In this embodiment mode, description is made on a light-emitting element having a different structure than those shown in Embodiment Mode 3 to Embodiment Mode 5. In the structure shown in this embodiment mode, a plurality of light-emitting units are stacked, and a layer containing a composite material of the invention is used as a charge-generating layer of the light-emitting element.

Figure 19:
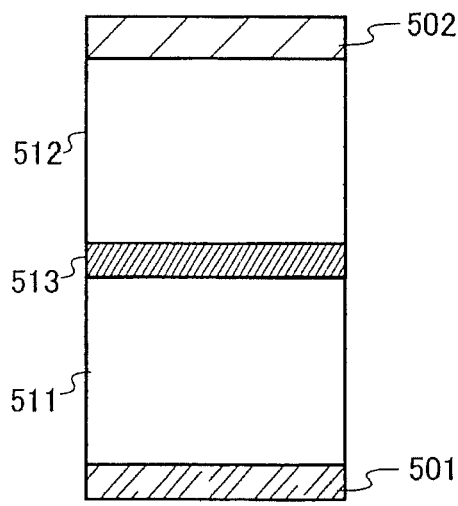
FIG. 19 illustrates a light-emitting element of the invention.

This embodiment mode illustrates a light-emitting element having a structure where a plurality of light-emitting units are stacked (hereinafter referred to as a tandem element). That is, a light-emitting element having a plurality of light-emitting units between a first electrode and a second electrode is described. FIG. 19 shows a tandem element where two light-emitting units are stacked.

In FIG. 19, a stack of a first light-emitting unit 511 and a second light-emitting unit 512 is sandwiched between a first electrode 501 and a second electrode 502. A charge-generating layer 513 is formed between the first light-emitting unit 511 and the second light-emitting unit 512.

The first electrode 501 and the second electrode 502 may be formed by using known materials.

Each of the first light-emitting unit 511 and the second light-emitting unit 512 may have a known structure.

The charge-generating layer 513 includes a layer containing a composite material shown in Embodiment Mode 1. The layer containing a composite material has high conductivity in the stacked direction. Accordingly, the driving voltage of the light-emitting element can be decreased. Meanwhile, the layer containing a composite material has low conductivity in the surface direction. Accordingly, cross talk which would be generated between adjacent light-emitting elements can be suppressed.

Note that the charge-generating layer 513 may be formed by combining a layer containing a composite material with a known material. For example, the charge-generating layer 513 may be formed by combining a layer containing a composite material with a layer containing a compound selected from among electron-donating substances and also containing a compound with a high electron transporting property as shown in Embodiment Mode 4. Alternatively, it may be formed by combining a layer containing a composite material with a light-transmissive conductive film.

Although description is made in this embodiment mode on the light-emitting element having two light-emitting units, a layer containing a composite material shown in Embodiment Mode 1 can be similarly applied to a light-emitting element having three or more stacked light-emitting units. For example, a light-emitting element having three stacked light-emitting units has a structure where a first light-emitting unit, a first charge-generating layer, a second light-emitting unit, a second charge-generating layer, and a third light-emitting unit are stacked in this order. The layer containing a composite material shown in Embodiment Mode 1 may be included in any one of or all of the charge-generating layers.

The light-emitting element of the invention has a layer containing a composite material shown in Embodiment Mode 1. Therefore, the layer containing a composite material can be changed in electrical characteristics by changing the length of one cycle of the periodic change in the concentration ratio of an organic compound to an inorganic compound included in the layer containing a composite material. That is, the electrical characteristics can be changed without changing the composition ratio of the organic compound to the inorganic compound in the layer or changing the kind of compounds used for the layer. Therefore, other characteristics such as the optical characteristics are not changed much. Accordingly, a light-emitting element can be designed and manufactured with redundancy.

Note that this embodiment mode can be appropriately implemented in combination with other embodiment modes.
(Embodiment Mode 7)

In this embodiment mode, description is made on the optical design of a light-emitting element.

In using the light-emitting elements shown in Embodiment Mode 3 to Embodiment Mode 6, the extraction efficiency of light for each color can be increased by varying the thickness of at least one of the layers other than the first electrode and the second electrode among each light-emitting element.

Figure 10:
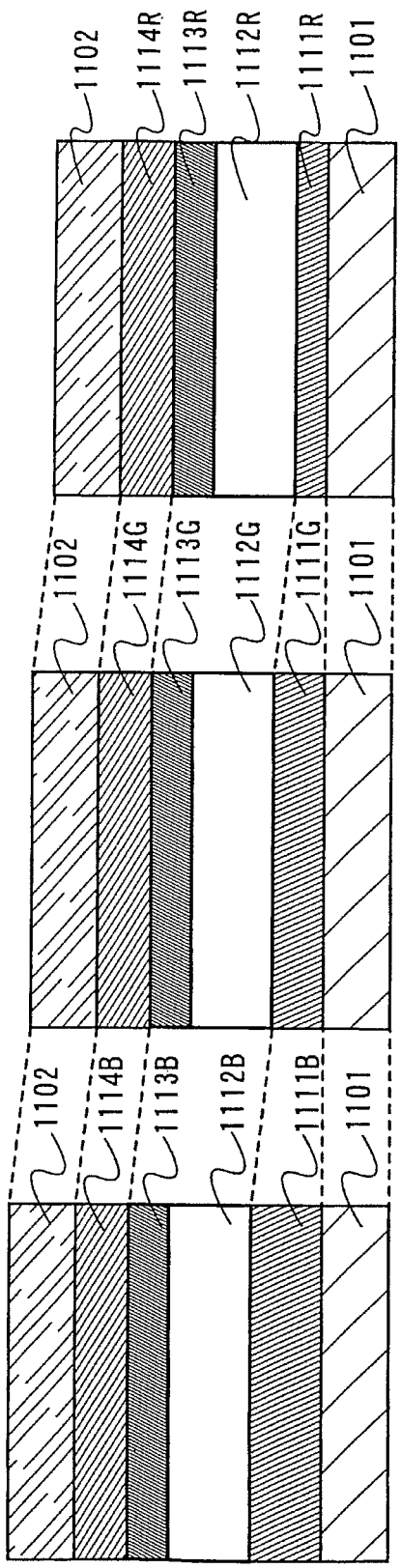
FIG. 10 illustrates a light-emitting element of the invention.

For example, as shown in FIG. 10, light-emitting elements which respectively emit light with a red color (R), green color (G), and blue color (B) share a first electrode 1101 as a reflective electrode and a second electrode 1102 having a light-transmitting property. The light-emitting element which emits red light has a first layer 1111R, a second layer 1112R, a third layer 1113R, and a fourth layer 1114R. The light-emitting element which emits green light has a first layer 1111G, a second layer 1112G, and a third layer 1113G, and a fourth layer 1114G. The light-emitting element which emits blue light has a first layer 1111B, a second layer 1112B, a third layer 1113B, and a fourth layer 1114B. The first layers 1111R, 1111G and 1111B are formed to have different thickness from each other.

Note that when a voltage which allows a potential of the first electrode 1101 to be higher than that of the second electrode 1102 is applied to the light-emitting element shown in FIG. 10, holes are injected into the second layer 1112 from the first layer 1111. Electrons are given/received in the vicinity of an interface between the third layer 1113 and the fourth layer 1114, and electrons and holes are generated. At this time, the third layer 1113 transports electrons to the second layer 1112 while the fourth layer 1114 transports holes to the second electrode 1102. The holes and electrons are recombined in the second layer 1112 to bring the light-emissive substance into an excited state. The light-emissive substance in the excited state emits light in returning to the ground state.

By varying the respective thickness of the first layers 1111R, 1111G, and 1111B for each emission color as shown in FIG. 10, the light extraction efficiency can be prevented from decreasing, which would otherwise be caused by having a different optical path between the case where the light emission is recognized directly through the second electrode and the case where the light emission is recognized through the second electrode after being reflected by the first electrode.

Specifically, in the case where light enters the first electrode, the reflected light is inverted in phase, which yields an interference effect of light. As a result, the extraction efficiency of light to the outside can be increased if the optical distance between the light-emitting region and the reflective electrode, that is the refraction index times distance is (2 m−1)/4 times (m is an arbitrary positive integer) as large as the emission wavelength, specifically when the refraction index times distance is ¼, ¾, 5/4 or . . . . On the other hand, if the refraction index times distance is m/2 times (m is an arbitrary positive integer) as large as the emission wavelength, specifically when the refraction index times distance is ½, 1, 3/2 or . . . , the extraction efficiency of light to the outside is decreased.

Accordingly, in the light-emitting element of the invention, the thickness of one of the first to fourth layers is varied between each light-emitting element in order that the optical distance between the light-emitting region and the reflective electrode, that is the refraction index times distance, can be (2 m−1)/4 times (m is an arbitrary positive integer) as large as the emission wavelength.

In particular, it is preferable to vary the thickness of a layer provided between the reflective electrode and the layer where electrons and holes are recombined, among the first to fourth layers. Alternatively, the thickness of a layer provided between the light-transmissive electrode and the layer where electrons and holes are recombined may be varied as well. Further, both of such layers may be varied in thickness. As a result, light can be efficiently extracted to the outside.

In order to vary the thickness of one of the first to fourth layers, the layer is required to be formed thick. The light-emitting element of the invention has a feature that a layer containing a composite material shown in Embodiment Mode 1 is used as the layer to be formed thick.

In general, when a layer of a light-emitting element is formed thick, the driving voltage of the light-emitting element is undesirably increased. However, if a layer containing a composite material shown in Embodiment Mode 1 is used as the layer to be formed thick, the driving voltage per se can be suppressed, thereby the driving voltage can be prevented from increasing even when the layer is formed thick.

Note that FIG. 10 shows an example where the optical distance between a light-emitting region and a reflective electrode of a light-emitting element for red (R) emission is ¼ times as long as the emission wavelength, the optical distance between a light-emitting region and a reflective electrode of a light-emitting element for green (G) emission is ¾ times as long as the emission wavelength, and the optical distance between a light-emitting region and a reflective electrode of a light-emitting element for blue (B) emission is 5/4 times as long as the emission wavelength. Note that the invention is not limited to these values, and the value of m may be set appropriately. In addition, as shown in FIG. 10, the value of m in (2 m−1)/4 may be different among each light-emitting element as shown in FIG. 10.

By forming one of the first to fourth layers to be thick, short circuit between the first electrode and the second electrode can be prevented, which is quite preferable for increasing the productivity.

In this manner, by using the light-emitting element of the invention, at least one of the first to fourth layers may be varied in thickness among light-emitting elements for the respective emission colors. At this time, a layer provided between the reflective electrode and the layer where electrons and holes are recombined is preferably varied in thickness among the light-emitting elements for the respective emission colors. Further, a layer containing a composite material shown in Embodiment Mode 1 is preferably used for the layer which is required to be formed thick because the driving voltage of the light-emitting element can be prevented from increasing accordingly.

Note that although this embodiment mode illustrates a light-emitting element with a structure shown in Embodiment Mode 5, it may be combined with other embodiment modes.

(Embodiment Mode 8)

In this embodiment mode, description is made on a light-emitting device having the light-emitting element of the invention.

In this embodiment mode, description is made with reference to FIGS. 7A and 7B on a light-emitting device having the light-emitting element of the invention in a pixel portion. Note that FIG. 7A is a top view of a light-emitting device, and FIG. 7B is a cross-sectional view taken along lines A-A' and B-B' of FIG. 7A. Reference numeral 601 indicated by a dashed line denotes a driver circuit portion (source side driver circuit), 602 denotes a pixel portion, and 603 denotes a driver circuit portion (gate side driver circuit). Reference numeral 604 denotes a sealing substrate, 605 denotes a sealant, and an interior side of the sealant 605 is a space 607.

Note that a lead wire 608 is a wire for transmitting signals inputted to the source side driver circuit 601 and the gate side driver circuit 603, which receives video signals, clock signals, start signals, reset signals, and the like from an FPC (Flexible Printed Circuit) 609 to serve as an external input terminal. Note that although only the FPC is shown here, a printed wiring board (PWB) may be connected to the FPC. A light-emitting device in this specification includes not only a main body of a light-emitting device but also a light-emitting device in the condition where an FPC or a PWB is connected thereto.

Next, description is made with reference to FIG. 7B on the cross-sectional structure thereof. A driver circuit portion and a pixel portion are formed over an element substrate 610. Here, the source side driver circuit 601 as a driver circuit portion and one pixel in the pixel portion 602 are shown.

Note that a CMOS circuit having an n-channel TFT 623 and a p-channel TFT 624 is formed in the source side driver circuit 601. The driver circuit may be constructed of a known CMOS circuit, PMOS circuit, or NMOS circuit. In addition, although this embodiment mode illustrates an example where a driver circuit and a pixel portion are formed over a common substrate, the invention is not limited to such a structure. For example, the driver circuit may be formed outside the substrate.

The pixel portion 602 is constructed of a plurality of pixels each having a switching TFT 611, a current-controlling TFT 612, and a first electrode 613 electrically connected to a drain of the current-controlling TFT 612. Note that an insulator 614 is formed covering an end portion of the first electrode 613. Here, the insulator 614 is formed by using a positive photosensitive acrylic resin film.

The insulator 614 is formed to have a curved surface with a curvature on its top end portion or bottom end portion. For example, in the case where the insulator 614 is formed by using positive photosensitive acrylic, it is preferable that only the top portion of the insulator 614 have a curved surface with a curvature radius (0.2 to 0.3 μm). In addition, the insulator 614 may be formed by using either a negative resist, a portion of which irradiated with light is insoluble in an etchant, or a positive resist, a portion of which irradiated with light is soluble in an etchant.

Over the first electrode 613, a layer 616 containing a light-emissive substance and a second electrode 617 are formed in this order. Here, the first electrode 613 functioning as an anode is preferably formed of a material with a high work function. For example, there is a single-layer film of an ITO film, a film of indium tin oxide containing silicon, a film of indium oxide containing 2 to 20 w % of zinc oxide, a titanium nitride film, a chromium film, a tungsten film, a Zn film, a Pt film, or the like, as well as a stacked layer of a titanium nitride film and a film containing aluminum as a main component, a three-layer structure of a titanium nitride film, a film containing aluminum as a main component, and a titanium nitride film, or the like. Note that if the first electrode 613 is formed to have a stacked structure, resistance as a wire can be suppressed low, favorable ohmic contact can be obtained, and further it can function as an anode.

The layer 616 containing a light-emissive substance has a layer containing a composite material shown in Embodiment Mode 1. As other materials which constitute the layer 616 containing a light-emissive substance, a low molecular material, a medium molecular material (including oligomer and dendrimer), or a high molecular material may be used. The materials used for the layer containing a light-emissive substance are generally formed in a single layer or a stacked layer of organic compounds. In the invention, such a structure can also be employed that a film formed of an organic compound partially includes an inorganic compound. In addition, the layer 616 containing a light-emissive substance may be formed by a known method such as vapor deposition using a vapor-deposition mask, ink-jet deposition, or spin coating. Note that the layer containing a composite material is preferably formed by the method shown in Embodiment Mode 1 or Embodiment Mode 2.

As a material used for the second electrode 617 which is formed over the layer 616 containing a light-emissive substance and functions as a cathode, a material with a low work function is preferably used such as Al, Ag, Li, or Ca, or an alloy or compound thereof such as MgAg, MgIn, AlLi, $CaF_2$, LiF, or calcium nitride. In the case where light generated in the layer 616 containing a light-emissive substance travels through the second electrode 617, the second electrode 617 is preferably formed by using a stacked layer of a thin metal film and a light-transmissive conductive film (ITO, indium oxide containing 2 to 20 wt % of zinc oxide, indium tin oxide containing silicon, zinc oxide (ZnO), or the like).

Further, by attaching the sealing substrate 604 to the element substrate 610 with the sealant 605, such a structure is obtained that a light-emitting element 618 is provided in the space 607 surrounded by the element substrate 610, the sealing substrate 604, and the sealant 605. Note that the space 607 is filled with a filling material such as an inert gas (e.g., nitrogen, argon, or the like) or the sealant 605.

Note also that the sealant 605 is preferably formed with an epoxy resin. It is desirable that such a material should not transmit moisture or oxygen as mush as possible. As a material used for the sealing substrate 604, a glass substrate or a quartz substrate may be used as well as a plastic substrate formed of FRP (Fiberglass-Reinforced Plastic), PVF (polyvinylfluoride), mylar, polyester, acrylic, or the like.

In this manner, a light-emitting device having the light-emitting element of the invention can be obtained.

The light-emitting device of the invention has a layer containing a composite material shown in Embodiment Mode 1. Therefore, the layer containing a composite material can be changed in electrical characteristics by changing the length of one cycle of the periodic change in the concentration ratio of an organic compound to an inorganic compound included in the layer containing a composite material. That is, the electrical characteristics can be changed without changing the composition ratio of the organic compound to the inorganic compound in the layer or changing the kind of compounds used for the layer. Therefore, other characteristics such as the optical characteristics are not changed much. Accordingly, a light-emitting device can be designed and manufactured with redundancy.

In addition, since the light-emitting device of the invention has a layer containing a composite material shown in Embodiment Mode 1, conductivity in the stacked direction can be increased. Therefore, the driving voltage of the light-emitting element can be decreased. Meanwhile, since the conductivity in the surface direction can be low, cross talk which would be generated between adjacent light-emitting elements can be suppressed.

In addition, since the layer containing a composite material shown in Embodiment Mode 1 has high conductivity in the stacked direction, the driving voltage of the light-emitting element can be prevented from increasing even when the layer containing a composite material is formed thick. Therefore, short circuit of the light-emitting element can be prevented by forming the layer containing a composite layer to be thick. Further, a light-emitting device with reduced power consumption can be obtained.

In addition, since the layer containing a composite material can be formed to have a desired thickness, the color purity and the light extraction efficiency can be increased by optical designs without the need for increasing the driving voltage of the light-emitting element. Thus, a light-emitting device having reduced power consumption and increased reliability can be obtained.

Figure 8:
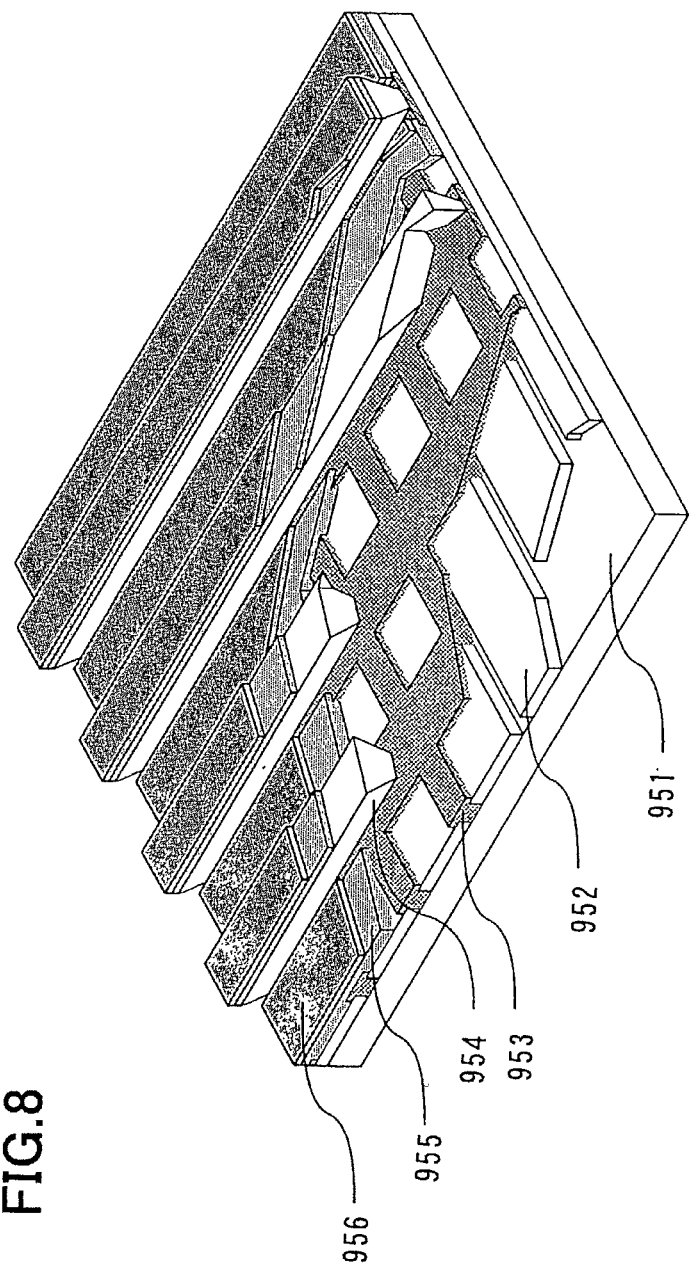
FIG. 8 illustrates a light-emitting device of the invention.

As described heretofore, although this embodiment mode illustrates an active matrix light-emitting device where drive of light-emitting elements is controlled with TFTs, a passive matrix light-emitting device may be formed as well, where light-emitting elements are driven without specifically providing driving elements such as transistors. FIG. 8 shows a perspective view of a passive matrix light-emitting device manufactured in accordance with the invention. In FIG. 8, a layer 955 containing a light-emissive substance is provided between an electrode 952 and an electrode 956 over a substrate 951. An end portion of the electrode 952 is covered with an insulating layer 953. Over the insulating layer 953, a partition layer 954 is provided. The partition layer 954 has tapered sidewalls with such a slope that the distance between opposite sidewalls diminishes toward the substrate surface. That is, the cross section of the partition layer 954 in the short side direction has a trapezoidal shape where a bottom base (side in the same direction as the surface direction of the insulating layer 953, which is in contact with the insulating layer 953) is shorter than a top base (side in the same direction as the surface direction of the insulating layer 953, which is not in contact with the insulating layer 953). By providing the insulating layer 954 in this manner, defects of light-emitting elements resulting from static electricity or the like can be prevented. In the passive matrix light-emitting device also, low-power-consumption drive can be achieved by providing the light-emitting element of the invention which can operate with low driving voltage.

(Embodiment Mode 9)

In this embodiment mode, description is made on electronic apparatuses of the invention each having a light-emitting device shown in Embodiment Mode 8 as its component. The electronic apparatus of the invention includes a layer containing a composite material shown in Embodiment Mode 1, and has a display portion with low power consumption. The electronic apparatus of the invention also has a highly reliable display portion where short circuit caused by dust, shocks, or the like is suppressed.

As an electronic apparatus manufactured with the light-emitting device of the invention includes a camera (e.g., video camera, digital camera, or the like), a goggle display, a navigation system, an audio reproducing device (e.g., car audio, audio component stereo, or the like), a computer, a game machine, a portable information terminal (e.g., mobile computer, portable phone, portable game machine, electronic book, or the like), an image reproducing device provided with a recording medium (specifically, a device for reproducing a recording medium such as a digital versatile disc (DVD) and having a display device for displaying the reproduced image), and the like. Specific examples of such electronic apparatuses are shown in FIG. 9A to FIG. 9E.

Figure 9A:
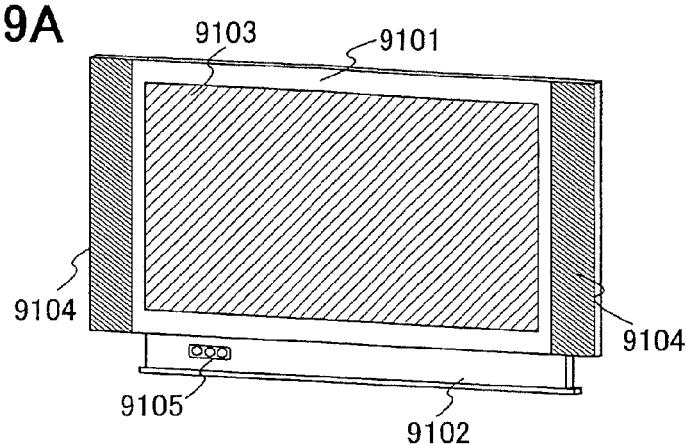
FIGS. 9A to 9E illustrate electronic apparatuses each using the light-emitting device of the invention.

FIG. 9A shows a television set in accordance with the invention, which includes a housing 9101, a supporting base 9102, a display portion 9103, speaker portions 9104, a video input terminal 9105, and the like. In this television set, the display portion 9103 has a matrix arrangement of light-emitting elements which are similar to the ones described in Embodiment Modes 3 to 7. The light-emitting elements have such advantages that the extraction efficiency of light to the outside is high, the driving voltage is low, and short circuit due to dust, shocks, and the like can be prevented. In addition, cross talk which would be generated between adjacent light-emitting elements can be suppressed. Since the display portion 9103 constructed of such light-emitting elements has similar characteristics, this television set has no degradation in image quality and consumes low power. With such characteristics, the television set can have a significantly reduced number or size of a degradation correction function and power source circuits. Therefore, the housing 9101 and the supporting base 9102 can be reduced in size and weight. Since the television set in accordance with the invention can achieve low power consumption, high image quality and reduction in size and weight, products suitable for any residential environment can be provided.

Figure 9B:
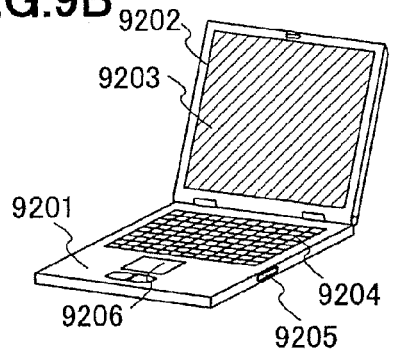

FIG. 9B shows a computer in accordance with the invention, which includes a main body 9201, a housing 9202, a display portion 9203, a keyboard 9204, an external connecting port 9205, a pointing mouse 9206, and the like. In this computer, the display portion 9203 has a matrix arrangement of light-emitting elements which are similar to the ones described in Embodiment Modes 3 to 7. The light-emitting elements have such advantages that the extraction efficiency of light to the outside is high, the driving voltage is low, and short circuit due to dust, shocks, and the like can be prevented. In addition, cross talk which would be generated between adjacent light-emitting elements can be suppressed. Since the display portion 9203 constructed of such light-emitting elements has similar characteristics, this computer has no degradation in image quality and consumes low power. With such characteristics, the computer can have a significantly reduced number or size of a degradation correction function and power source circuits. Therefore, the main body 9201 and the housing 9202 can be reduced in size and weight. Since the computer in accordance with the invention can achieve low power consumption, high image quality, and reduction in size and weight, products suitable for any residential environment and portable use can be provided. Further, the invention can provide a computer, a display portion of which is resistant to shocks even when carried outside.

Figure 9C:
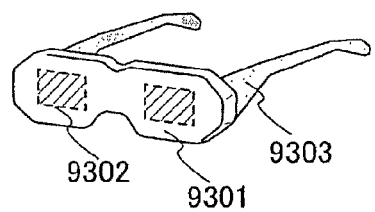

FIG. 9C shows a goggle display in accordance with the invention, which includes a main body 9301, a display portion 9302, an arm portion 9303, and the like. In this goggle display, the display portion 9302 has a matrix arrangement of light-emitting elements which are similar to the ones described in Embodiment Modes 3 to 7. The light-emitting elements have such advantages that the extraction efficiency of light to the outside is high, the driving voltage is low, and short circuit due to dust, shocks, and the like can be prevented. In addition, cross talk which would be generated between adjacent light-emitting elements can be suppressed. Since the display portion 9302 constructed of such light-emitting elements has similar characteristics, this goggle display has no degradation in image quality, and consumes low power. With such characteristics, the goggle display can have a significantly reduced number or size of a degradation correction function and power source circuits. Therefore, the main body 9301 can be reduced in size and weight. Since the goggle display in accordance with the invention can achieve low power consumption, high image quality and reduction in size and weight, the user suffers few uncomfortable feeling, and thus comfortable products can be provided. Further, the invention can provide a goggle display, a display portion of which is resistant to shocks even when a user moves with his/her goggle display on.

Figure 9D:
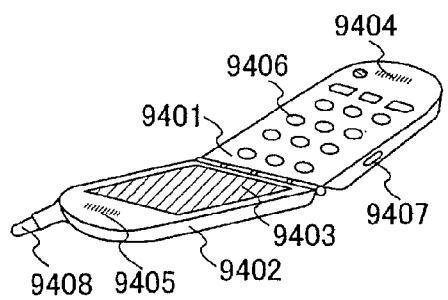

FIG. 9D shows a portable phone in accordance with the invention, which includes a main body 9401, a housing 9402, a display portion 9403, an audio input portion 9404, an audio output portion 9405, an operating key 9406, an external connecting port 9407, an antenna 9408, and the like. In this portable phone, the display portion 9403 has a matrix arrangement of light-emitting elements which are similar to the ones described in Embodiment Modes 3 to 7. The light-emitting elements have such advantages that the extraction efficiency of light to the outside is high, the driving voltage is low, and short circuit due to dust, shocks, and the like can be prevented. In addition, cross talk which would be generated between adjacent light-emitting elements can be suppressed. Since the display portion 9403 constructed of such light-emitting elements has similar characteristics, this portable phone has no degradation in image quality and consumes low power. With such characteristics, the portable phone can have a significantly reduced number or size of a degradation correction function and power source circuits. Therefore, the main body 9401 and the housing 9402 can be reduced in size and weight. Since the portable phone in accordance with the invention can achieve low power consumption, high image quality, and reduction in size and weight, products suitable for portable use can be provided. Further, the invention can provide products, a display portion of which is resistant to shocks even when carried outside.

Figure 9E:
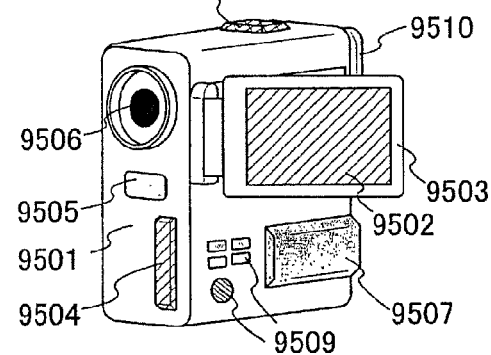

FIG. 9E shows a camera in accordance with the invention, which includes a main body 9501, a display portion 9502, a housing 9503, an external connecting port 9504, a remote controller receiving portion 9505, an image receiving portion 9506, a battery 9507, an audio input portion 9508, operating keys 9509, an eye piece portion 9510, and the like. In this camera, the display portion 9502 has a matrix arrangement of light-emitting elements which are similar to the ones described in Embodiment Modes 3 to 7. The light-emitting elements have such advantages that the extraction efficiency of light to the outside is high, the driving voltage is low, and short circuit due to dust, shocks, and the like can be prevented. In addition, cross talk which would be generated between adjacent light-emitting elements can be suppressed. Since the display portion 9502 constructed of such light-emitting elements has similar characteristics, this camera has no degradation in image quality and consumes low power. With such characteristics, the camera can have a significantly reduced number or size of a degradation correction function and power source circuits. Therefore, the main body 9501 can be reduced in size and weight. Since the camera in accordance with the invention can achieve low power consumption, high image quality, and reduction in size and weight, products suitable for portable use can be provided. Further, the invention can provide products, a display portion of which is resistant to shocks even when carried outside.

As described above, the applicable range of the light-emitting device of the invention is so wide that the light-emitting device can be applied to electronic apparatuses in various fields. By using the light-emitting device of the invention, electronic apparatuses having display portions with low power consumption and high reliability can be provided.

(Embodiment 1)

In this embodiment, description is made specifically on a layer containing a composite material.

Indium tin oxide containing silicon was formed over a substrate. Then, a layer formed by co-depositing DNTPD with molybdenum oxide was formed thereover to have a thickness of 120 nm with the condition that the weight ratio of DNTPD to molybdenum oxide in the whole layer is 1:0.67.

Then, aluminum was formed with a thickness of 200 nm over the layer formed by co-depositing DNTPD with molybdenum oxide, and the element characteristics were inspected.

Figure 11:
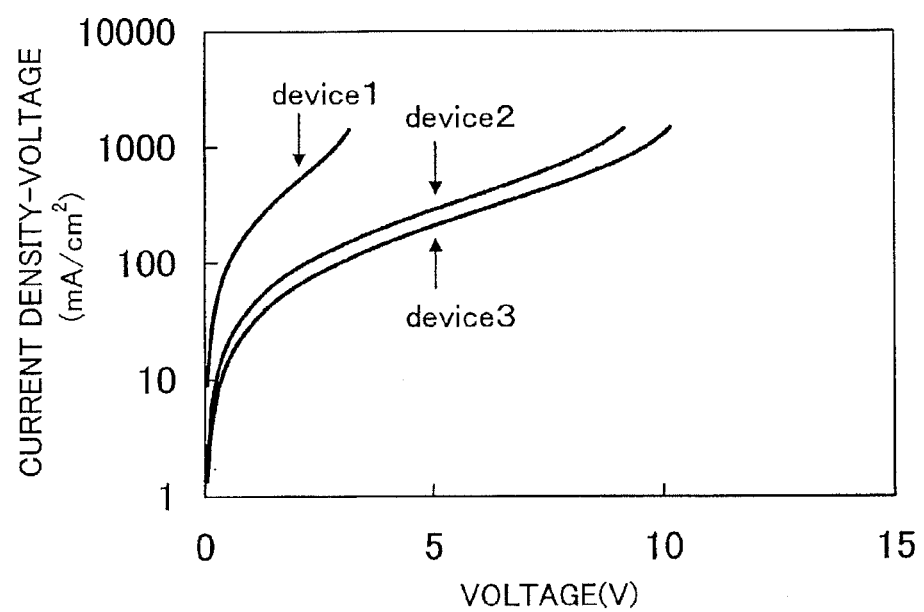
FIG. 11 illustrates the current density-voltage characteristics of a layer containing a composite material of the invention.

The following conditions were set. An element 1 was formed by co-depositing DNTPD with molybdenum oxide under the condition that the deposition rate of the organic compound is 0.4 nm/s, and the rotation rate of the substrate (orbital rotation) is 8 rpm. An element 2 was formed by co-depositing DNTPD with molybdenum oxide under the condition that the deposition rate of the organic compound is 0.4 nm/s, and the rotation rate of the substrate (orbital rotation) is 2 rpm. An element 3 was formed by co-depositing DNTPD with molybdenum oxide under the condition that the deposition rate of the organic compound is 1.6 nm/s, and the rotation rate of the substrate (orbital rotation) is 8 rpm. FIG. 11 shows the current density-voltage characteristics of the elements 1 to 3.

As is seen from FIG. 11, current can flow between electrodes (stacked direction) of the element 1 more easily than in the elements 2 and 3.

Figure 12:
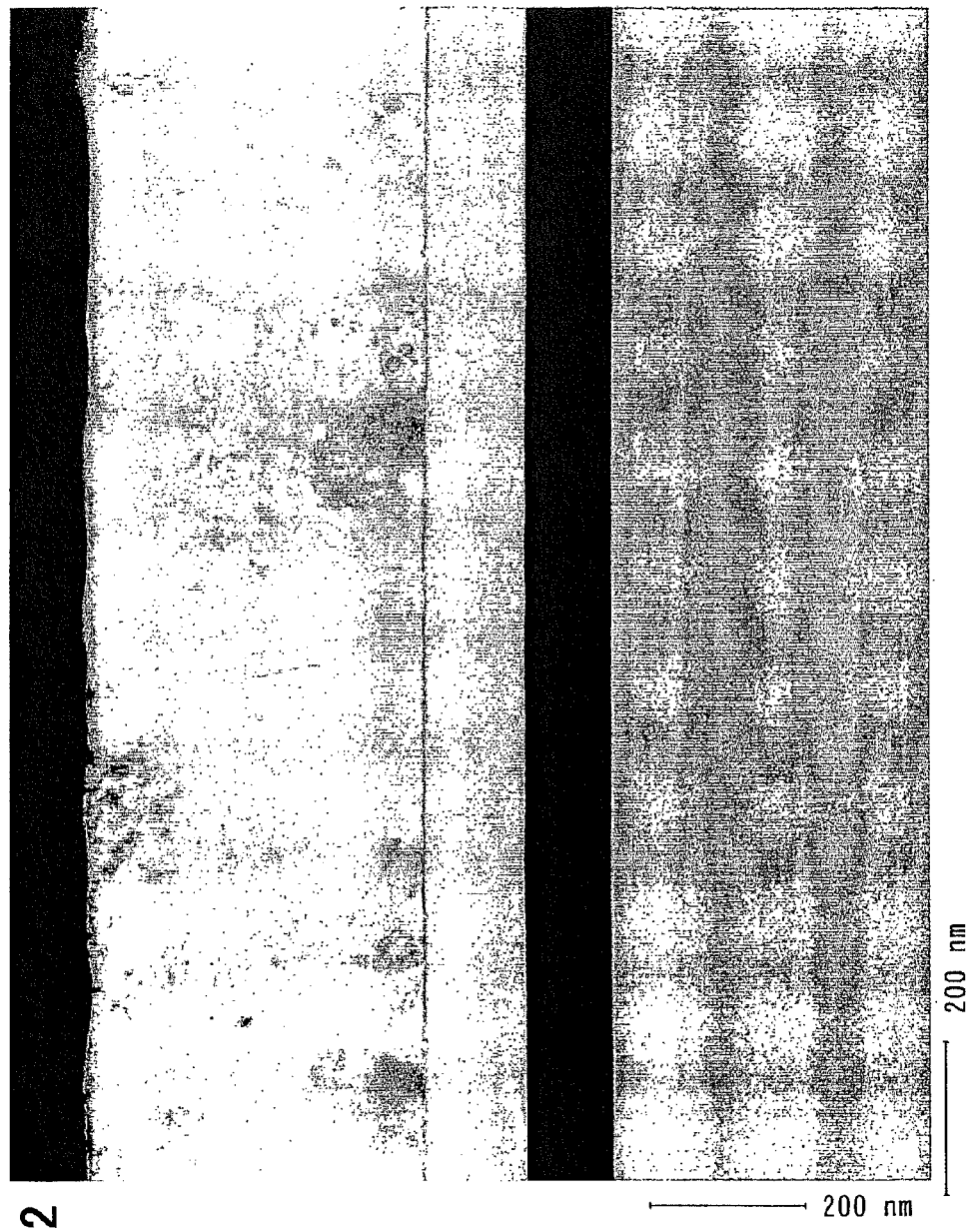
FIG. 12 shows the measurement result of a layer containing a composite material with a transmission electron microscope.
Figure 13:
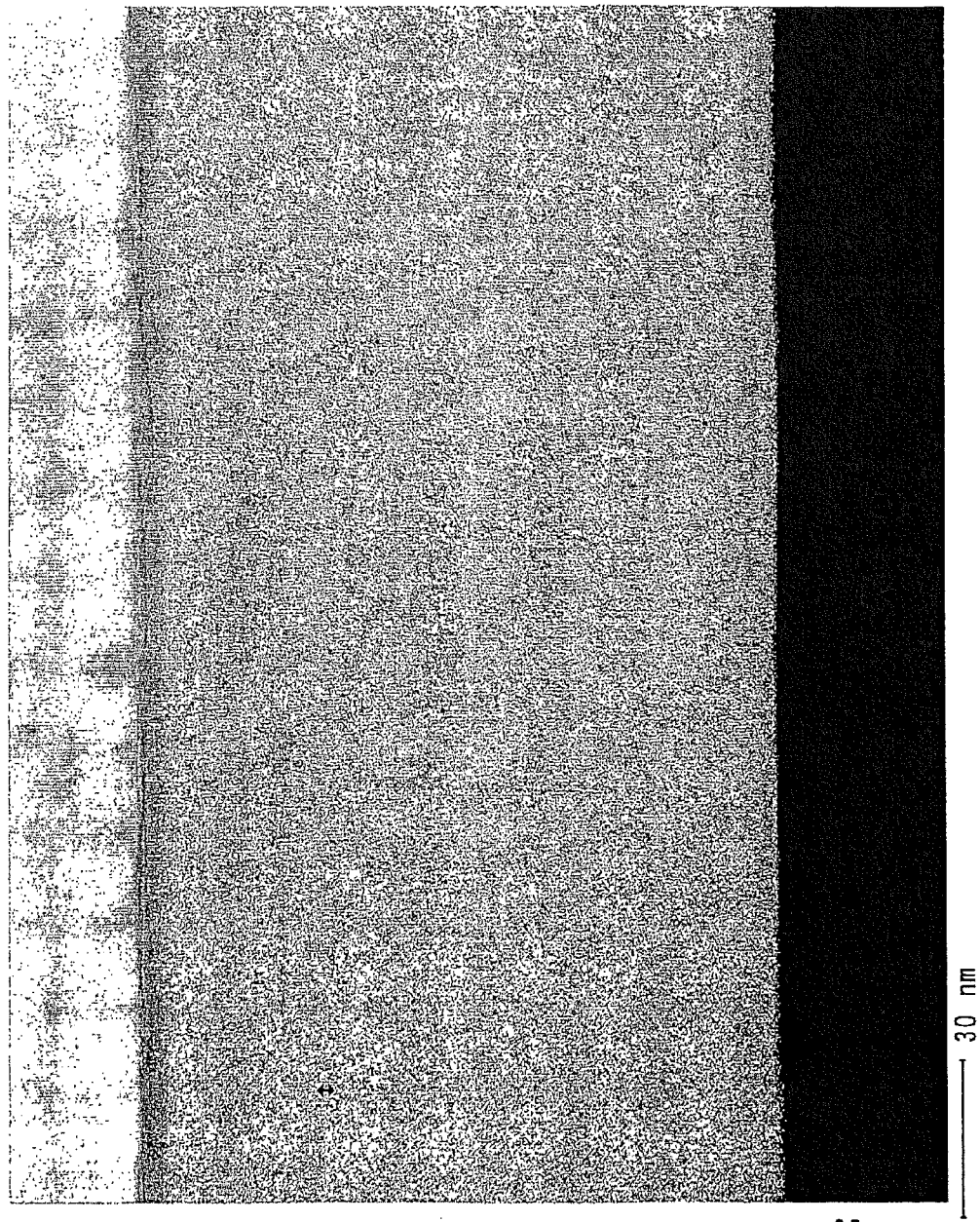
FIG. 13 shows the measurement result of a layer containing a composite material with a transmission electron microscope.
Figure 14:
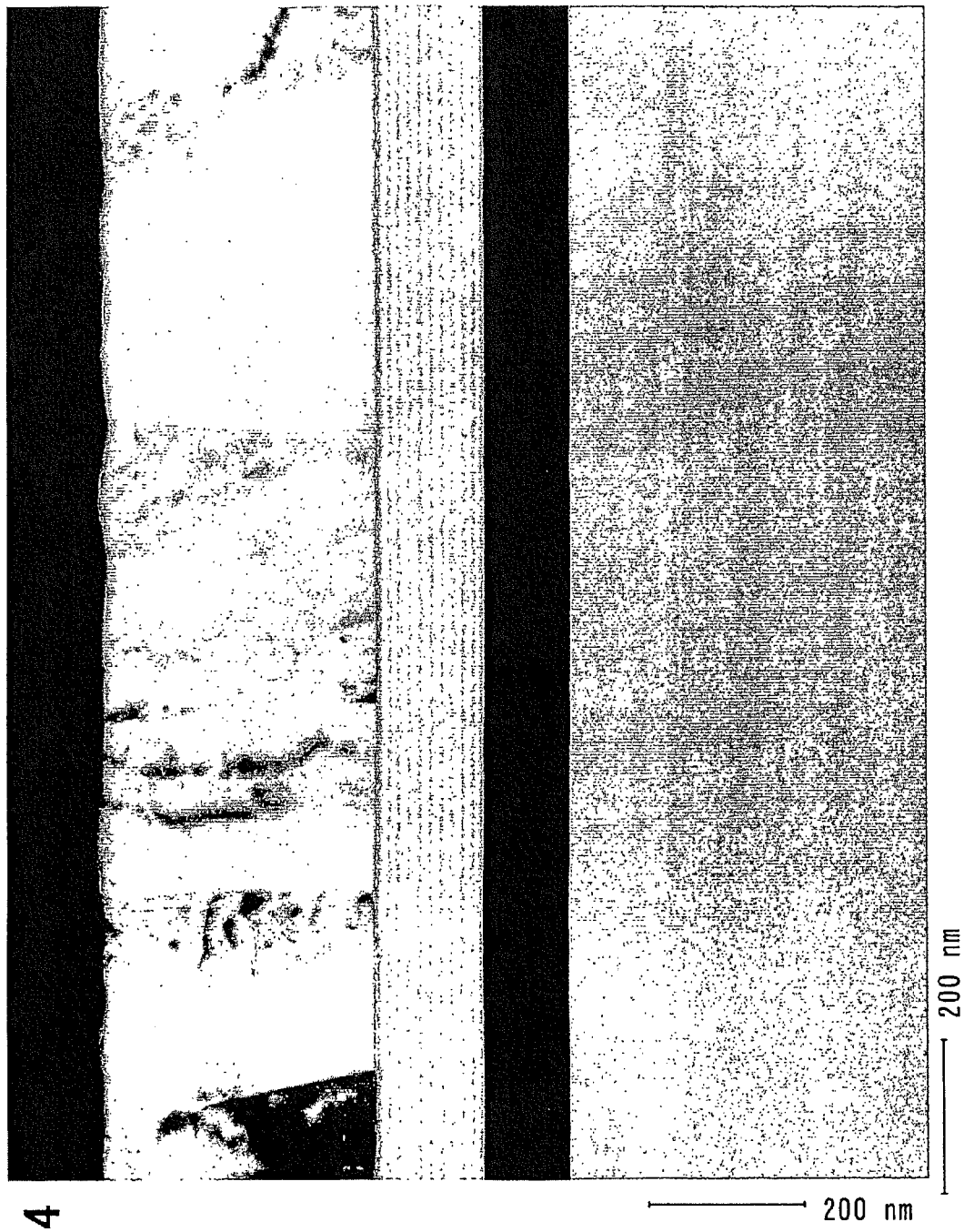
FIG. 14 shows the measurement result of a layer containing a composite material with a transmission electron microscope.
Figure 15:
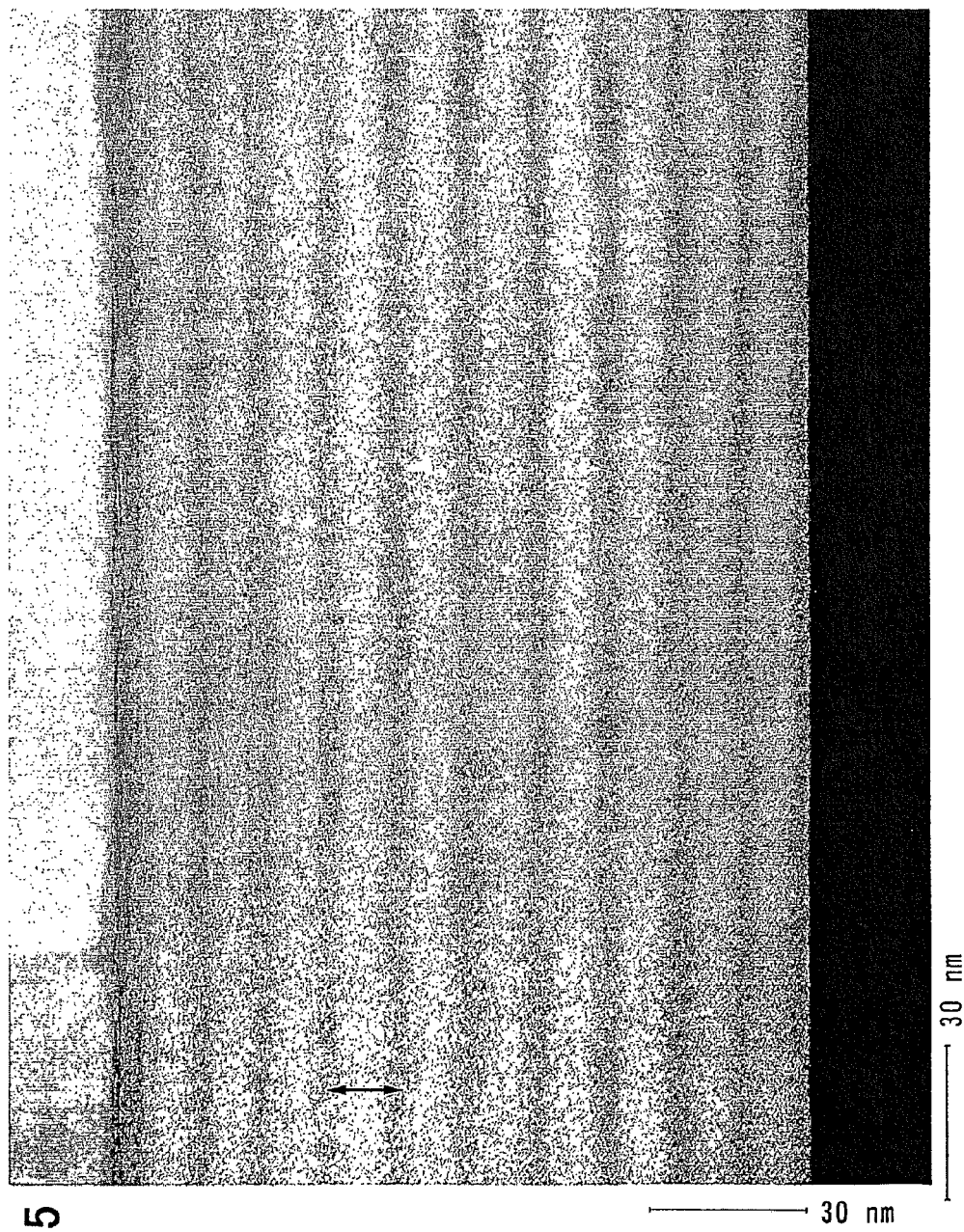
FIG. 15 shows the measurement result of a layer containing a composite material with a transmission electron microscope.
Figure 16:
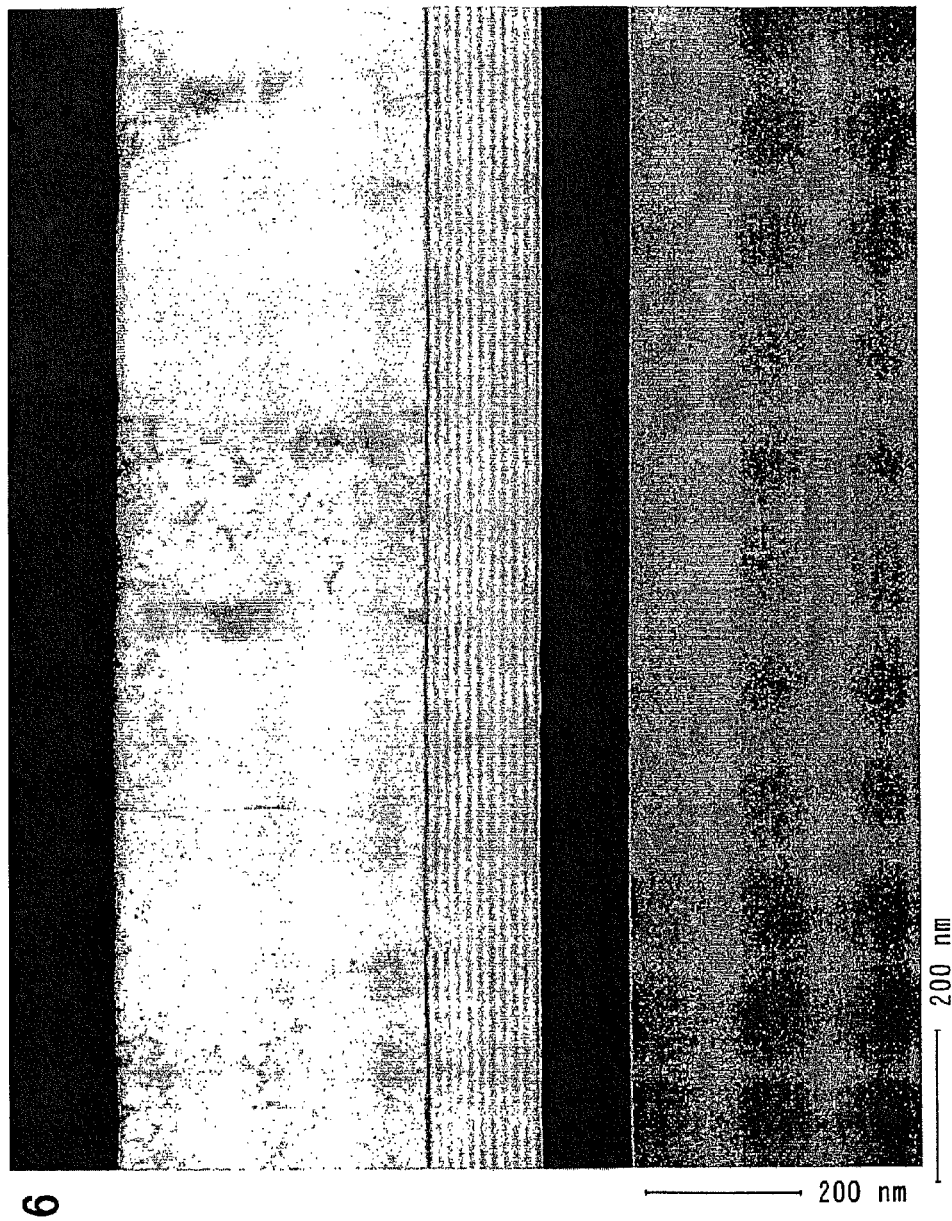
FIG. 16 shows the measurement result of a layer containing a composite material with a transmission electron microscope.
Figure 17:
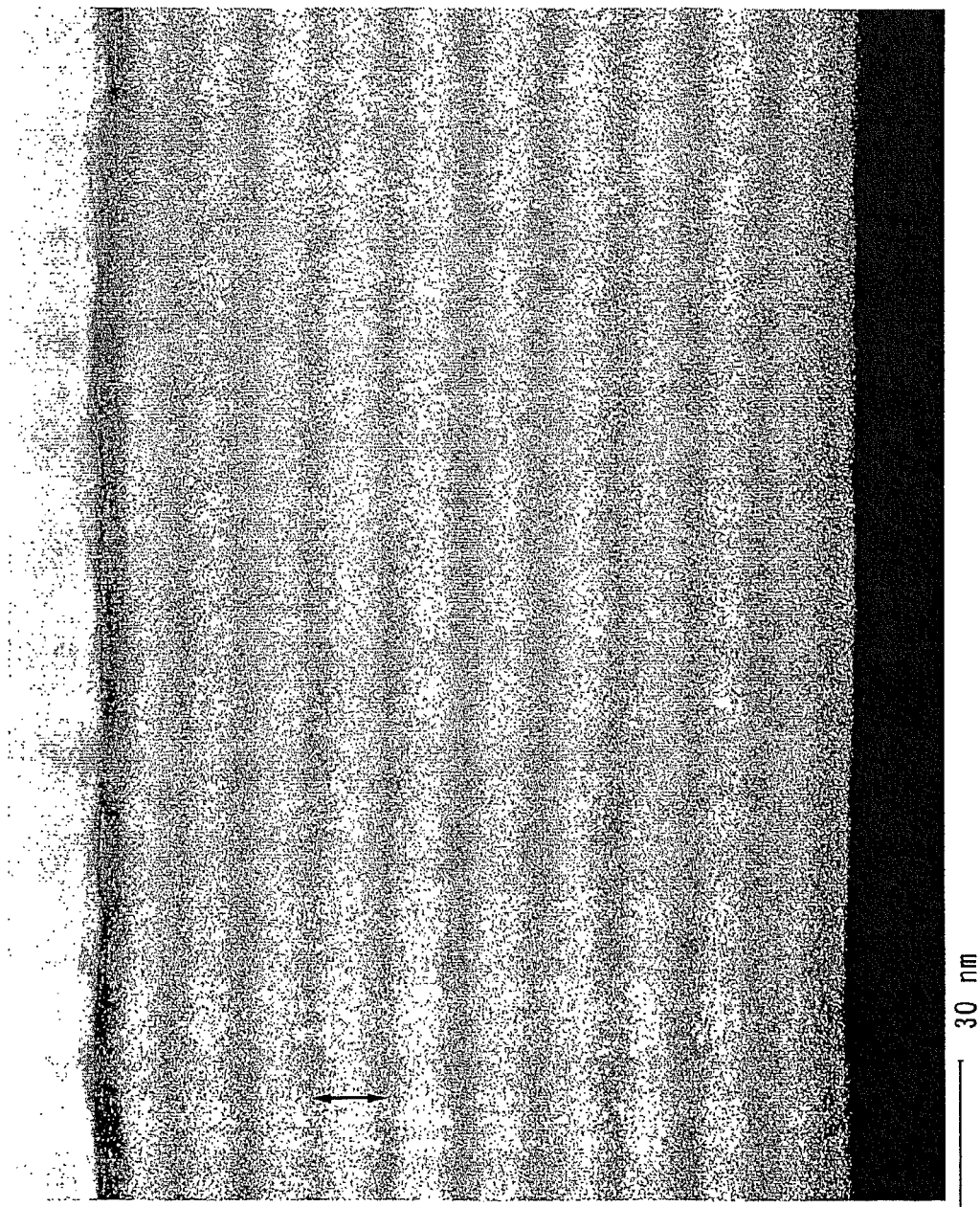
FIG. 17 shows the measurement result of a layer containing a composite material with a transmission electron microscope.

Cross sections of the elements 1 to 3 were observed with a transmission electron microscope. FIG. 12 to FIG. 17 show the observation results (TEM photographs). FIG. 12 shows an image of the element 1 (magnification of 150,000×). FIG. 13 shows an image of the element 1 (magnification of 1,000,000×). FIG. 14 shows an image of the element 2 (magnification of 150,000×). FIG. 15 shows an image of the element 2 (magnification of 1,000,000×). FIG. 16 shows an image of the element 3 (magnification of 150,000×). FIG. 17 shows an image of the element 3 (magnification of 1,000,000×).

From the results in FIG. 12 to FIG. 17, it can be seen that a first region with a dark color and a second region with a light color are alternately provided. The first region with a dark color is a region where the average atomic weight is high, while the second region with a light color is a region where the average atomic weight is low. Since the atomic weight of the inorganic compound is higher than that of the organic compound in the layer containing a composite material of the invention, the first region with a dark color in the TEM photographs corresponds to a region containing a larger amount of inorganic compound, while the second region with a light color corresponds to a region containing a larger amount of organic compound.

In this embodiment, the first region with a dark color is a region where the concentration of molybdenum oxide is higher, while the second region with a light color is a region where the concentration of DNTPD is higher. Accordingly, it can be confirmed in the element manufactured in this embodiment that the region having a high concentration of molybdenum oxide and the region having a low concentration of molybdenum oxide are alternately provided.

In addition, each arrow shown in FIG. 13, FIG. 15 and FIG. 17 indicates one cycle of the periodic change in the concentration ratio of DNTPD to molybdenum oxide. In the element 1, one cycle of the periodic change in the concentration ratio is as long as about 3 nm. In addition, in the elements 2 and 3, one cycle of the periodic change in the concentration ratio is as long as about 12 nm.

Accordingly, it can be seen that in the element 1, the region having a high concentration of molybdenum oxide and the region having a low concentration of molybdenum oxide are alternately provided in quite a shorter cycle than those of the elements 2 and 3. This shows that one cycle of the periodic change in the concentration ratio of DNTPD to molybdenum oxide is lengthened by increasing the deposition rate or by decreasing the rotation rate of the substrate.

In addition, from the observation results with a transmission electron microscope in FIG. 12 to FIG. 17 and the current density-voltage characteristics of FIG. 11, it can be seen that a current can easily flow in the stacked direction and the conductivity is thus improved by shortening the cycle of the periodic change in the concentration ratio of DNTPD to molybdenum oxide. Accordingly, by controlling the periodic change in the concentration ratio of the organic compound to the inorganic compound, a layer having desired conductivity can be formed.

Though the elements were observed with a transmission electron microscope in this embodiment, they are also observed with means for detecting a difference of a density or average atomic weight.

The present application is based on Japanese Priority application No. 2005-113053 filed on Apr. 11, 2005 with the Japanese Patent Office, the entire contents of which are hereby incorporated by reference.

Explanation of Reference

101: substrate, 102: first electrode, 103: first layer, 104: second layer, 105: third layer, 106: fourth layer, 107: second electrode, 200: substrate, 201: first electrode, 202: second electrode, 211: first layer, 212: second layer, 213: third layer, 214: fourth layer, 302: first electrode, 303: first layer, 304: second layer, 305: third layer, 306: fourth layer, 307: second electrode, 400: substrate, 401: first electrode, 402: second electrode, 411: first layer, 412: second layer, 413: third layer, 501: first electrode, 502: second electrode, 511: first light-emitting unit, 512: second light-emitting unit, 513: charge-generating layer, 601: source side driver circuit, 602: pixel portion, 603: gate side driver circuit, 604: sealing substrate, 605: sealant, 607: space, 608: wire, 609: FPC (Flexible Printed Circuit), 610: element substrate, 611: switching TFT, 612; current-controlling TFT, 613; first electrode, 614: insulator, 616: layer containing a light-emissive substance, 617:

second electrode, 618: light-emitting element, 623: n-channel TFT, 624: p-channel TFT, 951: substrate, 952: electrode, 953: insulator, 954; partition layer, 955: layer containing a light-emissive substance, 956: electrode, 1001: processing chamber, 1002: transfer chamber, 1003: arm, 1012: rotating plate, 1013: axis, 1022: holding portion, 1026: rotating plate, 1027: axis, 1032: holding portion, 1035: object to be processed, 1038: rotating plate, 1039: axis, 1040: opening, 1041: dashed line,. 1101: first electrode, 1102: second electrode, 1111: first layer, 1112: second layer, 1113: third layer, 1114: fourth layer, 9101: housing, 9102: supporting base, 9103: display portion, 9104: speaker portion, 9105: video input terminal, 9201: main body, 9202: housing, 9203: display portion, 9204: keyboard, 9205: external connecting port, 9206; pointing mouse, 9301: main body, 9302: display portion, 9303: arm portion, 9401: main body, 9402: housing, 9403: display portion, 9404: audio input portion, 9405: audio output portion, 9406: operating key, 9407; external connecting port, 9408: antenna, 9501: main body, 9502: display portion, 9503: housing, 9504: external connecting port, 9505: remote controller receiving portion, 9506: image receiving portion, 9507: battery, 9508: audio input portion, 9509: operating key, 9510: eyepiece portion, 1011*a*: evaporation source, 1011*b*: evaporation source, 1014*a*: rotating plate, 1014*b*: rotating plate, 1014*c*: rotating plate, 1014*d*: rotating plate, 1015*a*: object to be processed, 1015*b*: object to be processed, 1015*c*: object to be processed, 1015*d*: object to be processed, 1021*a*: evaporation source, 1021*b*: evaporation source, 1025*a*: processing object, 1031*a*: evaporation source, and 1031*b*: evaporation source.

The invention claimed is:

1. A method for manufacturing a layer comprising an organic compound, comprising:
   forming a layer that comprises a compound over a surface, so that a maximum value and a minimum value of a concentration of the compound are alternatively repeated in a direction perpendicular to the surface, so that at least two maximum values of the concentration of the compound and at least two minimum values of the concentration of the compound exist,
   wherein the minimum value is more than 0 wt %,
   wherein the compound is an organic compound, and
   wherein the layer that comprises the compound is one of a layer that comprises a light-emissive substance, a charge generating layer that comprises a composite material, a layer that comprises an organic compound having an electron transporting property, and a layer that comprises an organic compound having a hole transporting property.

2. The method for manufacturing the layer comprising an organic compound according to claim 1, wherein the layer is formed by an evaporation method.

3. The method for manufacturing the layer comprising an organic compound according to claim 1, wherein the maximum value and the minimum value change periodically.

4. The method for manufacturing the layer comprising an organic compound according to claim 1, wherein a concentration of the compound is not less than 10 wt % and not more than 95 wt %.

5. The method for manufacturing the layer comprising an organic compound according to claim 1,
   wherein the layer is formed by an evaporation method in which the surface is rotated around a first axis and rotated around a second axis,
   wherein the first axis intersects with the surface, and
   wherein the second axis does not intersect with the surface.

6. The method for manufacturing a device, comprising the method for manufacturing the layer comprising an organic compound according to claim 1, wherein the device is a light-emitting device comprising at least one of a power source circuit, a housing, an operating key, a flexible printed circuit, and a printed wiring board.

7. A light-emitting device comprising the layer manufactured by the method according to claim 1.

8. A method for manufacturing a layer comprising an organic compound, comprising:
   forming a layer that comprises both a first compound and a second compound over a surface, so that a maximum value and a minimum value of a concentration ratio of the first compound and the second compound are alternatively repeated in a direction perpendicular to the surface, so that at least two maximum values of the concentration ratio of the first compound and the second compound and at least two minimum values of the concentration ratio of the first compound and the second compound exist,
   wherein the minimum value is more than 0 wt %,
   wherein the first compound is an organic compound, and
   wherein the layer that comprises the first compound is one of a layer that comprises a light-emissive substance, a charge generating layer that comprises a composite material, a layer that comprises an organic compound having an electron transporting property, and a layer that comprises an organic compound having a hole transporting property.

9. The method for manufacturing the layer comprising an organic compound according to claim 8, wherein the layer is formed by an evaporation method.

10. The method for manufacturing the layer comprising an organic compound according to claim 8, wherein the maximum value and the minimum value change periodically.

11. The method for manufacturing the layer comprising an organic compound according to claim 8, wherein a concentration of the first compound is not less than 10 wt % and not more than 95 wt %.

12. The method for manufacturing the layer comprising an organic compound according to claim 8,
    wherein the layer is formed by an evaporation method in which the surface is rotated around a first axis and rotated around a second axis,
    wherein the first axis intersects with the surface, and
    wherein the second axis does not intersect with the surface.

13. The method for manufacturing the layer comprising an organic compound according to claim 8, wherein the second compound is an organic compound.

14. The method for manufacturing a device, comprising the method for manufacturing the layer comprising an organic compound according to claim 8, wherein the device is a light-emitting device comprising at least one of a power source circuit, a housing, an operating key, a flexible printed circuit, and a printed wiring board.

15. A light-emitting device comprising the layer manufactured by the method according to claim 8.

16. A method for manufacturing a layer comprising an organic compound, comprising:
    forming a layer that comprises a compound over a surface, so that a first region having a first average atomic weight of the compound and a second region having a second average atomic weight of the compound lower than the first average atomic weight are alternatively repeated in a direction perpendicular to the surface, so that at least two of the first regions and at least two of the second regions exist, wherein the layer comprises the first region and the second region, wherein the second average atomic weight is more than 0 wt %, wherein the compound is an organic compound, and wherein the layer that comprises the compound is one of a layer that comprises a light-emissive substance, a charge generating layer that comprises a composite material, a layer that comprises an organic compound having an electron transporting property, and a layer that comprises an organic compound having a hole transporting property.

17. The method for manufacturing the layer comprising an organic compound according to claim 16, wherein the layer is formed by an evaporation method.

18. The method for manufacturing the layer comprising an organic compound according to claim 16, wherein a maximum value and a minimum value of a concentration of the compound change periodically.

19. The method for manufacturing the layer comprising an organic compound according to claim 16, wherein a concentration of the compound is not less than 10 wt % and not more than 95 wt %.

20. The method for manufacturing the layer comprising an organic compound according to claim 16,
wherein the layer is formed by an evaporation method in which the surface is rotated around a first axis and rotated around a second axis,
wherein the first axis intersects with the surface, and
wherein the second axis does not intersect with the surface.

21. The method for manufacturing a device, comprising the method for manufacturing the layer comprising an organic compound according to claim 16, wherein the device is a light-emitting device comprising at least one of a power source circuit, a housing, an operating key, a flexible printed circuit, and a printed wiring board.

22. A light-emitting device comprising the layer manufactured by the method according to claim 16.

23. A method for manufacturing a layer comprising an organic compound, comprising:
forming a layer that comprises a compound over a surface, so that a first region having a first concentration of the compound, a second region having a second concentration of the compound, a third region having a third concentration of the compound, a fourth region having a fourth concentration of the compound are arranged in a direction perpendicular to the surface in this order,
wherein the layer comprises the first region, the second region, the third region, and the fourth region,
wherein the second concentration is larger than the first concentration,
wherein the third concentration is smaller than the second concentration,
wherein the fourth concentration is larger than the third concentration,
wherein each of the first concentration and the third concentration is more than 0 wt %,
wherein the compound is an organic compound, and
wherein the layer that comprises the compound is one of a layer that comprises a light-emissive substance, a charge generating layer that comprises a composite material, a layer that comprises an organic compound having an electron transporting property, and a layer that comprises an organic compound having a hole transporting property.

24. The method for manufacturing the layer comprising an organic compound according to claim 23, wherein the layer is formed by an evaporation method.

25. The method for manufacturing the layer comprising an organic compound according to claim 23, wherein a maximum value and a minimum value of a concentration of the compound change periodically.

26. The method for manufacturing the layer comprising an organic compound according to claim 23, wherein a concentration of the compound is not less than 10 wt % and not more than 95 wt %.

27. The method for manufacturing the layer comprising an organic compound according to claim 23,
wherein the layer is formed by an evaporation method in which the surface is rotated around a first axis and rotated around a second axis,
wherein the first axis intersects with the surface, and
wherein the second axis does not intersect with the surface.

28. The method for manufacturing a device, comprising the method for manufacturing the layer comprising an organic compound according to claim 23, wherein the device is a light-emitting device comprising at least one of a power source circuit, a housing, an operating key, a flexible printed circuit, and a printed wiring board.

29. The method for manufacturing the layer comprising an organic compound according to claim 23,
wherein the layer further comprises a fifth region having a fifth concentration of the compound, and a sixth region having a sixth concentration of the compound,
wherein the fourth region, the fifth region, and the sixth region are arranged in the direction in this order,
wherein the fifth concentration is smaller than the fourth concentration, and
wherein the sixth concentration is larger than the fifth concentration.

30. A light-emitting device comprising the layer manufactured by the method according to claim 23.

* * * * *

UNITED STATES PATENT AND TRADEMARK OFFICE
CERTIFICATE OF CORRECTION

PATENT NO. : 8,622,780 B2  
APPLICATION NO. : 13/402974  
DATED : January 7, 2014  
INVENTOR(S) : Hisao Ikeda et al.

It is certified that error appears in the above-identified patent and that said Letters Patent is hereby corrected as shown below:

In the Specification:

Column 6, line 47, replace "a-NPD" with --α-NPD--;

Column 6, line 52, replace "NN-diphenylamino" with --N,N-diphenylamino--;

Column 12, line 23, replace "a-NPD" with --α-NPD--;

Column 12, line 44, replace "Alg$_3$" with --Alq$_3$--;

Column 12, lines 57-58, replace "bis[2-(T-hydroxyphenyl)benzothiazolato]zinc" with --bis[2-(2'-hydroxyphenyl)benzothiazolato]zinc--;

Column 14, line 37, before "staggered" insert --a--;

Column 21, line 66, replace "(2 m - 1)/4" with --(2m - 1)/4--.

Signed and Sealed this  
Twenty-fourth Day of June, 2014

Michelle K. Lee  
*Deputy Director of the United States Patent and Trademark Office*